United States Patent
Dupuy et al.

(10) Patent No.: US 8,346,189 B2
(45) Date of Patent: Jan. 1, 2013

(54) POWER AMPLIFIER ARCHITECTURES

(75) Inventors: Alexandre Dupuy, San Diego, CA (US);
Raul Alidio, Carlsbad, CA (US); Ajay Gummalla, San Diego, CA (US); Maha Achour, San Diego, CA (US);
Cheng-Jung Lee, San Diego, CA (US);
Can Zheng, San Diego, CA (US)

(73) Assignee: Hollinworth Fund, L.L.C., Dover, DE (US)

( * ) Notice: Subject to any disclaimer, the term of this patent is extended or adjusted under 35 U.S.C. 154(b) by 0 days.

(21) Appl. No.: 13/469,640

(22) Filed: May 11, 2012

(65) Prior Publication Data

US 2012/0258677 A1    Oct. 11, 2012

Related U.S. Application Data

(62) Division of application No. 12/474,270, filed on May 28, 2009, now Pat. No. 8,180,303.

(60) Provisional application No. 61/056,826, filed on May 28, 2008.

(51) Int. Cl.
*H04B 1/04* (2006.01)

(52) U.S. Cl. ............. 455/114.1; 333/100; 330/124 R

(58) Field of Classification Search .... 455/114.1–115.4, 455/120–129; 330/124, 197, 295; 333/100
See application file for complete search history.

(56) References Cited

U.S. PATENT DOCUMENTS

| 7,405,698 | B2 | 7/2008 | de Rochemont |
| 2008/0001684 | A1 | 1/2008 | Itoh et al. |

OTHER PUBLICATIONS

Ahn, G., et al., "Design of a High-Efficiency and High-Power Inverted Doherty Amplifier," *IEEE Transactions on Microwave Theory and Techniques*, 55(6):1105-1111, Jun. 2007.
Caloz and Itoh, Electromagnetic Metamaterials: Transmission Line Theory and Microwave Applications, John Wiley & Sons (2006).
Collin, *Field Theory of Guided Waves*, John Wiley & Sons, Inc., 2nd Ed., Dec. 1990.
Cripps, S., RF Power Amplifiers for Wireless Communications, Chapter 8, pp. 219-250, Artech House Publishers, 1999.
Cripps, S., RF Power Amplifiers for Wireless Communications, Chapter 9, pp. 251-281, Artech House Publishers, 1999.
Dupuy, A., et at., "A Practical Scheme for Envelope Delta-Sigma Modulated (EDSM) Microwave Power Amplifier," *Microwave and Optical Technology Letters*, 43(6):491-495, Dec. 2004.
Dupuy, A., et al., "Class-F Power Amplifier Using a Multi-Frequency Composite Right/Left-Handed Transmission Line Harmonic Tuner," *IEEE MTT-S International Microwave Symposium Digest*, pp. 2023-2026, Jun. 2005.
Dupuy, A., et al., "Digital Pulse Width Modulated (PWM) Microwave Signal Using a High Efficiency Class-E Amplifier," *Proceedings of Asia-Pacific Microwave Conference*, pp. 1809-1812, (2003).
Dupuy, A., et al., "High Efficiency Power Transmitter Based on Envelope Delta-Sigma Modulation (EDSM)," *IEEE 60th Vehicular Technology Conference (VTC2004-Fall)*, vol. 3, pp. 2092-2095, Sep. 2004.

(Continued)

*Primary Examiner* — Christian Hannon
(74) *Attorney, Agent, or Firm* — Connolly Bove Lodge & Hutz LLP

(57) ABSTRACT

Implementations and examples of power amplifier devices, systems and techniques for amplifying RF signals, including power amplifier systems based on Composite Right and Left Handed (CRLH) metamaterial (MTM) structures.

17 Claims, 31 Drawing Sheets

OTHER PUBLICATIONS

Ji, S.H., et al., "Linearity Improved Doherty Power Amplifier Using Composite Right/Left-Handed Transmission Lines," *IEEE Microwave and Wireless Components Letters*, 18(8):533-535, Aug. 2008.

Mata-Contreras, J., et al., "Assessment of a Composite Right/Left-Handed Transmission Line-Based Distributed Amplifier Implemented in Microstrip Technology," *Proceedings of the 36th European Microwave Conference*, pp. 1586-1589, Sep. 2006.

Mata-Contreras, J., et al., "Experimental Performance of a Meta-Distributed Amplifier," *Proceedings of the 37th European Microwave Conference*, pp. 743-746, Oct. 2007.

Pozar, D.M., *Microwave Engineering*, 3rd Ed., John Wiley & Sons, 2005.

Eun, Sang-Ki, et al. "A High Linearity Chireix Outphasing Power Amplifier Using Composite Right/Left-Handed Transmission Lines." Proceedings of the 4th European Radar Conference 2007. EuRAD 2007. Oct. 10-12, 2007. Munich, Germany. pp. 343-346.

Koulouzis, Helias, et al. "LDMOS Power Amplifiers with CRLH Combiners for LINC Transmitters." Proceedings of the 36th European Microwave Conference. Manchester UK. Sep. 10-15, 2006. pp. 1181-1184.

International Search Report and Written Opinion dated Jan. 14, 2010 for International Application No. PCT/US2009/045547 filed May 28, 2009 (10 pages).

Composite ($\beta=\beta_L+\beta_R$) Left and Right Handed Metamaterial Dispersion Diagram

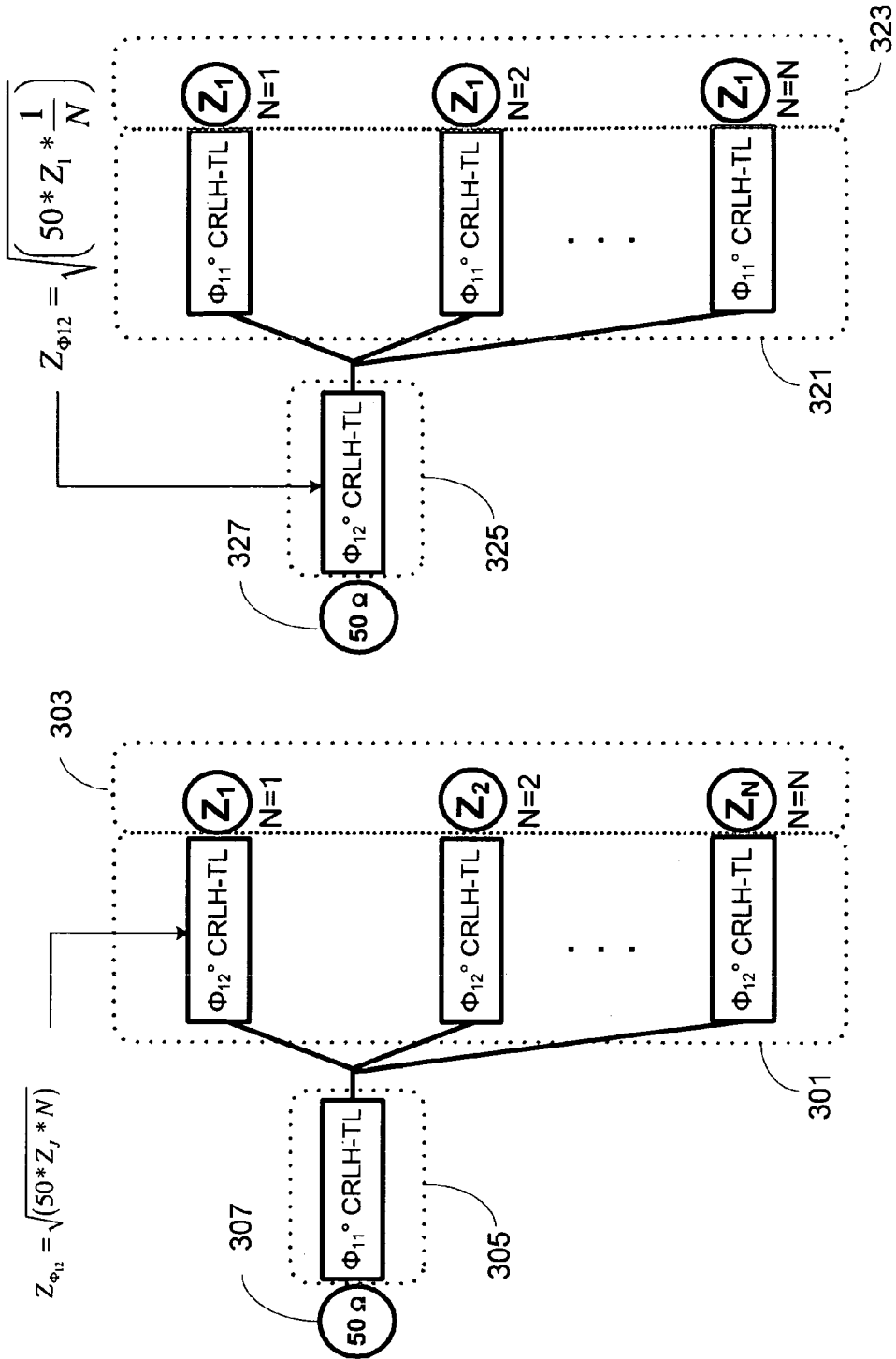

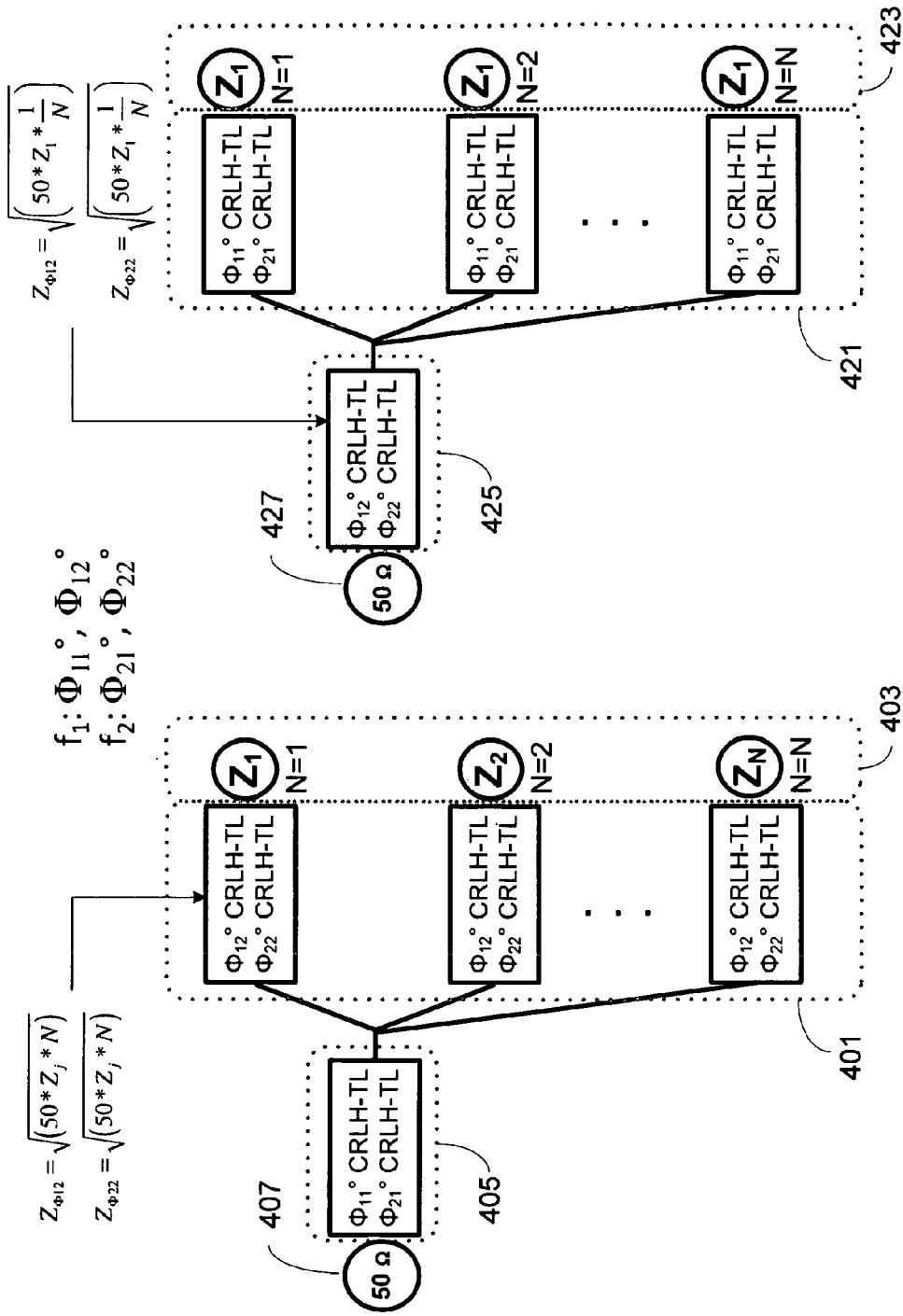

conventional branch line coupler:
$\theta_1 = \theta_2 = -\pi/2$

MTM branch line coupler:
choose $\theta_1 = -\pi/2$ and $\theta_2 = +\pi/2$

POWER AMPLIFIER ARCHITECTURES

PRIORITY CLAIM AND RELATED APPLICATION

This application is a divisional application of U.S. patent application Ser. No. 12/474,270, entitled, "POWER AMPLIFIER ARCHITECTURES," and filed on May 28, 2009, now U.S. Pat. No. 8,180,303 which claims the benefits of U.S. Provisional Patent Application Ser. No. 61/056,826, entitled, "POWER AMPLIFIER ARCHITECTURES FOR HIGH EFFICIENCY AND HIGH LINEARITY USING METAMATERIAL STRUCTURES," and filed on May 28, 2008, the specifications of which are incorporated by reference as part of the specification of this application.

BACKGROUND

This patent document relates to power amplifier devices, systems and techniques for amplifying RF signals.

Power amplifiers (PAs) are devices that amplify power of RF signals by converting DC power into RF power and are used in various RF devices and systems. Many power amplifiers used in a transceiver system tend to occupy a large chip or board area, require high DC power, and need to dissipate heat generated during operation. Good efficiency and linearity of the PAs are demanded in wireless communications and other RF applications. Many wireless standards targeting high communication throughput utilize complex modulation schemes to generate an RF signal with both amplitude and phase components. Such schemes may impose stringent linearity requirements on the PAs in the system. In addition, the PAs are required to operate at adequate levels of efficiencies to minimize battery power consumption and heat dissipation.

SUMMARY

Implementations and examples of power amplifier devices, systems and techniques for amplifying RF signals are provided, including power amplifier systems based on Composite Right and Left Handed (CRLH) metamaterial (MTM) structures.

In one aspect, a power amplifier system for amplifying an RF signal is provided to include an input port that receives an input RF signal and a power divider including an input transmission line coupled to the input port to receive the input RF signal and output branch transmission lines that are coupled to the input transmission line to split the received input RF signal into branch RF signals that are respectively carried by the output branch transmission lines. This system includes power amplifiers that are coupled to the output branch transmission lines of the power divider, respectively and each power amplifier receives and amplifies a respective branch RF signal to produce an amplified branch RF signal. A power combiner is provided to include input branch transmission lines that are respectively coupled to the power amplifiers to receive amplified branch RF signals produced by the power amplifiers, and an output transmission line coupled to the input branch transmission lines to combine the received amplified branch RF signals into a combined output RF signal. At least one of the power divider and the power combiner includes a Composite Right and Left Handed (CRLH) Metamaterial (MTM) structure.

In another aspect, a device based on a Composite Right and Left Handed (CRLH) Metamaterial (MTM) structure includes a first transmission line including a Composite Right and Left Handed (CRLH) Metamaterial (MTM) structure, a first terminal that is terminated at a first impedance and a second terminal; and second transmission lines of CRLH MTM structures that are coupled to the second terminal of the first transmission line to either split an input RF signal received from the second terminal of the first transmission line into output RF signals in the second transmission lines, respectively, or combine input RF signals in the second transmission lines into an output RF signal at the second terminal of the first transmission line. Each second transmission line has a first terminal that is coupled to the second terminal of the first transmission line and a second terminal that is terminated at a respective second impedance. The first transmission line and the second transmission lines are structured to provide impedance match between the first impedance at the first terminal of the first transmission line and a respective second impedance of each of the second transmission lines. In this device, the first transmission line and the second transmission lines are structured to be a first configuration or a second configuration. In the first configuration, the first transmission line is a CRLH MTM transmission line of an electrical length having a phase delay of $\pm m90°$ where m is a positive odd integer, and each of the second transmission lines is a CRLH MTM transmission line of an electrical length having a zero phase delay or a phase delay of $\pm n180°$ where n is a positive integer. In the second configuration, the first transmission line is a CRLH MTM transmission line of an electrical length having a zero phase delay or a phase delay of $\pm m180°$ where m is a positive integer and each of the second transmission lines is a CRLH MTM transmission line having a phase delay of $\pm n90°$ where n is a positive odd integer.

In another aspect, a power amplifier system includes an RF input port for receiving an input RF signal; an envelope detector coupled to the RF input port to receive a first portion of the input RF signal to extract information on an amplitude envelope of the input RF signal to produce an envelope signal; a sigma-delta modulator coupled to the envelope detector to convert the envelope signal into a first signal; a limiter circuit coupled to the RF input port to receive a second portion of the input RF signal to eliminate amplitude modulation components of the input RF signal to produce a second signal that retains phase of the input RF signal; a time delay circuit coupled to the limiter circuit to cause a delay in the second amplifier input signal to synchronize with the first signal; a modulator coupled to receive the first and second signals and to combine the received first and second signals into a third signal; and a power amplifier coupled to the modulator to receive and amplify the third signal into an output RF signal which is proportional to the input RF signal. The power amplifier is a Composite Right and Left Handed (CRLH) Metamaterial (MTM) structure power amplifier.

In another aspect, a power amplifier system is provided to include an RF input port for receiving an input RF signal; an envelope detector coupled to the RF input port to receive a first portion of the input RF signal to extract information on an amplitude envelope of the input RF signal to produce an envelope signal; a sigma-delta modulator coupled to the envelope detector to convert the envelope signal into a first signal; a limiter circuit coupled to the RF input port to receive a second portion of the input RF signal to eliminate amplitude modulation components of the input RF signal to produce a second signal that retains phase of the input RF signal; a time delay circuit coupled to the limiter circuit to cause a delay in the second amplifier input signal to synchronize with the first signal; a power amplifier coupled to receive the first and second signals to produce an output RF signal which is proportional to the input RF signal; and a filter coupled to the power amplifier to filter the output RF signal and having a Composite Right and Left Handed (CRLH) Metamaterial (MTM) structure.

In another aspect, a power amplifier system for amplifying an RF signal includes an input port that receives an input RF signal; and transmission lines based on Composite Right and Left Handed (CRLH) Metamaterial (MTM) structures and connected in series to receive the input RF signal from the input port. Each transmission line has a CRLH MTM structure to produce, at an operating frequency, a zero phase delay or a phase delay of n360° where n is a positive or negative integer and includes a branch output port that splits a portion of the RF signal as a respective branch RF signal for the transmission line and different transmission lines producing different respective branch RF signals. This system includes power amplifiers that are coupled to the branch output ports of the transmission lines, respectively, and each power amplifier receives and amplifies a respective branch RF signal to produce an amplified branch RF signal. A power combiner based on a CRLH MTM structure is coupled to receive the amplified branch RF signals from the power amplifiers and to combine the received amplified branch RF signals into a combined output RF signal.

In another aspect, a power amplifier system for amplifying an RF signal includes a Zeroth order resonator power divider having a Composite Right and Left Handed (CRLH) Metamaterial (MTM) structure that receives an input RF signal and splits the received input RF signal into branch RF signals in phase with respective to one another, transistors coupled to the Zeroth order resonator power divider to receive the branch RF signals, respectively, and to amplify the received branch RF signals, and a Zeroth order resonating antenna based on a CRLH MTM structure and coupled to transistors to receive amplified branch RF signals.

In yet another aspect, a power amplifier system is provided to include an RF input for receiving an input RF signal and a first quadrature coupler based on a Composite Right and Left Handed (CRLH) Metamaterial (MTM) structure. This first quadrature coupler has a first input port coupled to the RF input to receive the input RF signal, a second input port that is terminated, a first output port and a second output port. The first quadrature coupler splits the input RF signal into a first RF signal at the first output port and a second RF signal at the second output port that has a phase shift of 90 degrees with respect to the first RF signal. A first power amplifier us coupled to the first output port to receive and amplify the first RF signal and a second power amplifier is coupled to the second output port to receive and amplify the second RF signal. This system includes a second quadrature coupler based on a CRLH MTM structure that includes a first input port coupled to receive the amplified first RF signal from the first power amplifier, a second input port coupled to receive the amplified second RF signal from the second power amplifier, a first output port that is terminated and a second output to produce an RF output signal. The second quadrature coupler combines signals received at the first and second input ports with a 90-degree phase shift to produce the RF output signal.

These and other implementations and their variations are described in detail in the attached drawings, the detailed description and the claims.

BRIEF DESCRIPTION OF THE DRAWINGS

FIG. 3A shows an example of: a Single Band N-Way MTM Power Combiner/Splitter that has a zero-degree MTM transmission line coupled to N branch MTM transmission lines with electrical lengths of quarter wavelengths FIG. 3B shows an example of a Single Band N-Way MTM Power Combiner/Splitter that has a quarter-wavelength MTM transmission line coupled to N zero-degree branch MTM transmission lines;

FIG. 4A illustrates a multi-band N-Way MTM Power Combiner/Splitter with one Zero Degree CRLH TL and N Quarter Wavelength CRLH TLs;

FIG. 4B illustrates a multi-band N-Way MTM Power Combiner/Splitter with one Quarter Wavelength CRLH TL and N Zero Degree CRLH TL;

DETAILED DESCRIPTION

Figure 1A:
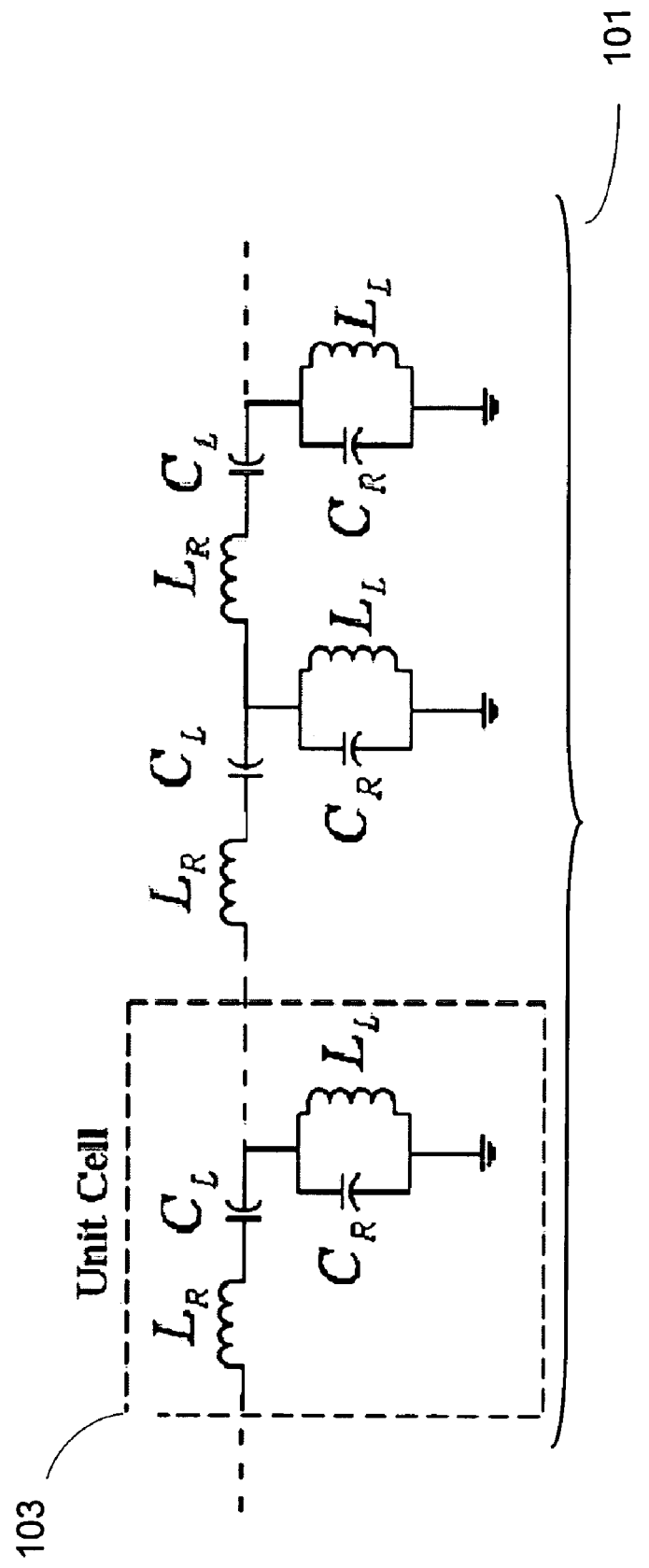
FIG. 1A illustrates an Equivalent Circuit Model for CRLH TL with Lumped Elements.

Various power amplifier architectures are available for designing RF devices and systems. Some implementations for the techniques, devices and systems described in this document can incorporate features in various power amplifier architectures.

Linear PAs biased Class AB are widely used in RF applications while other PA architectures are also used such as certain PA architectures used in Global System for Mobile communications (GSM), General Packet Radio Service (GPRS) communication systems and Enhanced Data rates for GSM Evolution (EDGE) applications, some of which use the Gaussian Minimum Shift Keying (GMSK) modulation. In general, a Class A PA can be used to achieve good linearity at the expense of high DC power dissipation, thus achieving low efficiency. Class AB PAs can be used to obtain a good compromise of efficiency and linearity. By way of comparison, Class AB amplifiers can achieve higher efficiency than Class A amplifiers.

Many power amplifiers are designed to achieve their maximum efficiencies when operated to produce their respective maximum power levels. Various wireless standards targeting high communication throughput utilize complex modulation schemes by manipulating both amplitude and phase components to generate an RF signal. Such techniques may impose stringent linearity requirements on the PAs in the system. At the same time, the PAs may be required to operate at adequate levels of efficiencies to minimize battery power consumption and to reduce heat dissipation. Thus, PA designs that achieve good efficiency and linearity are desired for wireless communication systems. In addition to operating in the linear region while maintaining adequate efficiency, modern wireless applications may require devices to support multiple frequency bands. In some implementations, PAs are designed to operate in their respective single bands and are packaged into a single module to provide multiple band operations.

Some modulation schemes used in wireless systems, such as Quadrature Amplitude Modulation (QAM) with Orthogonal Frequency Divisional Multiple Access (OFDMA) or Code Division Multiple Access (CDMA), create RF signals that have a high Peak to Average Power Ratio (PAPR) in the range of 7-15 dB, for example. To avoid this, the PA is set to operate so as to output the power that is lower than its peak output power until the linearity requirements are just met. This operation is referred to as "power back-off" and can significantly reduce the efficiency of the PA when the PA is designed to achieve its maximum efficiency at or near its maximum power level. Typical Power Added Efficiency (PAE) values for OFDM signals (802.11a/g, n, WiMax) are 15% to 20% @ 3% RMS EVM or <10% @ 2% RMS EVM, where EVM stands for Error Vector Magnitude. In an RF power amplifier, PAE is defined as the ratio of the difference between the output and input RF power to the DC power consumed, whereas drain efficiency is defined as the ratio of the output power to the DC power consumed.

In many PA designs, the linearity and good efficiency do not occur simultaneously. The PA output power may be backed off from its maximum power to meet linearity requirements while compromising the PA efficiency during the backing-off operation.

To increase the output power of a PA, either the voltage swing or the current swing of the PA needs to be increased. Conventionally, the size of the device periphery is increased to allow a large current swing. An increase in the device size can increase its maximum power, but also decreases its optimum load impedance, which is difficult to match. The architectures presented in this application can use any technology available. Examples include printing the designs on a conventional FR-4 PCB, Duroid and using thin/thick-film ceramic techniques based on alumina or Low Temperature Co-fired Ceramic (LTCC). Another example is a monolithic fabrication. The architectures presented herein are applicable to most Monolithic Microwave Integrated Circuits (MMIC) semiconductor processes. These include GaAs-, InGaP-, SiGe-, GaN, InP, Si-based fabrication processes and others. The transistors in the different architectures can be FET, pHEMT, HBT, CMOS, LDMOS and BiCMOS transistors and the like based on the appropriate device process technology.

Examples of power amplifier (PA) architectures designed to enhance efficiency and linearity include the Doherty amplifier, the Envelope Elimination and Restoration (EER), and the Linear amplification using Non-linear Components (LINC). Distributed amplifier architectures can be used for broadband amplification. These and other different techniques and architectures can integrate different classes of amplification. Examples include a class A/B/AB/C/D/E/F/F-1/J or a combination thereof. Each class presents some advantages and disadvantages depending on the performance requirements.

The Doherty architecture uses two or more power amplifiers and operates in the back-off region in order to maintain good linearity with good efficiency. The Doherty architecture has the advantage of being easy to implement, and there is no need for a high-power modulator that restricts the bandwidth requirement. A PA system based on the Doherty architecture can include two power amplifiers: a carrier PA or main PA and one peak PA or auxiliary PA. These two power amplifiers are evenly or unevenly fed with input power and can be designed to operate in any of the classes mentioned above. Some Doherty PA implementations use a class-AB PA for the carrier PA and a class-C PA for the peak PA.

In operation of a Doherty PA system, when the input power is low, the peak PA is OFF, and the carrier PA is ON, acting as a controlled current source seeing twice the optimum resistance. In this state, the carrier PA has reached to one half of its maximum current and its maximum voltage. When the input power increases to a certain level, the peak PA turns ON and acts as a controlled current source, and the carrier PA acts as a controlled voltage source in this case. When the current of the peak PA increases, the impedance seen by the carrier PA decreases. Therefore, the output voltage remains constant. When the input power reaches its maximum, the two PAs experience optimum impedance which can be equal to the characteristic impedance of the quarter wavelength. The current is at a maximum at this level. The peak amplifier modulates the load during the signal peak so as to prevent the carrier PA from saturating. It is possible to unevenly feed the Doherty PA by applying more power to the peak PA than to the carrier PA in order to fully modulate the load impedance to the value of the optimum impedance at high power level. This results in more output power than the case in which the PAs are driven with the same amount of power. Inverted Doherty architecture improves carrier cell efficiency at low levels when the peak PA is OFF. In this case, the challenge is to design the output matching with the quarter wavelength.

A distributed power amplifier is a structure that can exhibit broadband characteristics in terms of gain, group delay and impedance matching. A balanced power amplifier splits an input signal into two identical PAs by using a phase quadrature coupler, and then the two outputs of the PAs are recombined by using another phase quadrature coupler. The advantage of using phase quadrature couplers is that any mismatch reflection from any of the PAs appears in antiphase and does not affect the input or output of the system. The balanced configuration can therefore enhance the stability of the PA and is insensitive to the load mismatch.

In addition to the above and other PA architectures, the techniques, devices and systems described in this document can be implemented based on different circuit structures. The propagation of electromagnetic waves in most materials obeys the right handed rule for the (E,H,β) vector fields, where E is the electrical field, H is the magnetic field, and β is the wave vector. The phase velocity direction is the same as the direction of the signal energy propagation (group velocity) and the refractive index is a positive number. Such materials are "right handed" (RH). Most natural materials are RH materials. Artificial materials can also be RH materials. A metamaterial (MTM) has an artificial structure. When designed with a structural average unit cell size p much smaller than the wavelength of the electromagnetic energy guided by the metamaterial, the metamaterial can behave like a homogeneous medium to the guided electromagnetic energy. Unlike RH materials, a metamaterial can exhibit a negative refractive index with permittivity ε and permeability μ being simultaneously negative, and the phase velocity direction is opposite to the direction of the signal energy propagation where the relative directions of the (E,H,β) vector fields follow the left handed rule. Metamaterials that support only a negative index of refraction with permittivity ε and permeability p being simultaneously negative are pure "left handed" (LH) metamaterials. Many metamaterials are mixtures of LH metamaterials and RH materials and thus are Composite Right and Left Handed (CRLH) metamaterials. A CRLH metamaterial can behave like a LH metamaterial at low frequencies and a RH material at high frequencies. Designs and properties of various CRLH metamaterials are described in, for example, Caloz and Itoh, "Electromagnetic Metamaterials: Transmission Line Theory and Microwave Applications," John Wiley & Sons (2006). CRLH metamaterials and their applications in antennas are described by Tatsuo Itoh in "Invited paper: Prospects for Metamaterials," Electronics Letters, Vol. 40, No. 16 (August, 2004).

CRLH metamaterials can be structured and engineered to exhibit electromagnetic properties that are tailored for specific applications and can be used in applications where it may be difficult, impractical or infeasible to use other materials. In addition, CRLH metamaterials may be used to develop new applications and to construct new devices that may not be possible with RH materials. Examples of MTM antenna, transmission lines, RF power dividers and combiners can be found, e.g., in U.S. patent application Ser. No. 11/741,674 entitled "Antennas, Devices and Systems Based on Metamaterial Structures" and filed on Apr. 27, 2007 (U.S. Patent Publication No. US20080258981), Ser. No. 11/844,982 entitled "Antennas Based on Metamaterial Structures" and filed on Aug. 24, 2007 (U.S. Patent Publication No. US20080048917), Ser. No. 11/963,710 entitled "Power Combiners and Dividers Based on Composite Right and Left Handed Metamaterial Structures" and filed on Dec. 21, 2007 (U.S. Patent Publication No. 2009/0160575), and Ser. No. 12/340,657 entitled "Multi-Metamaterial-Antenna Systems with Directional Couplers" and filed on Dec. 20, 2008 (U.S. Patent Publication No. 2009/0219213), which are incorporated by reference as part of the disclosure of this document. The circuit structures for the present PA architectures can be based on RH material structures or CRLH MTM structures. As an example, the transmission lines used in the present PA architectures can be implemented by CRLH Metamaterial (MTM) transmission lines or circuit components to achieve multi-band or wide-band operations in compact form factors while complying with impedance and phase matching conditions. Consider a simple example of a 1-dimensional structure of CRLH MTM elements which can include MTM unit cells characterized by the cell shunt inductance (LL), the cell shunt capacitance (CR), the cell series inductance (LR) and the cell series capacitance (CL). These parameters and the number of MTM unit cells determine the resonant frequencies, the corresponding bandwidth, input and output impedance matching and the circuit structure and size. The LH properties of MTM structures allow the dimensions of MTM structures to be smaller than equivalent circuits made of RH materials, e.g., a fraction of λ/2, where λ is the propagation wavelength of an RF signal in the free-space. An CRLH transmission line can be designed to have an electrical length that corresponds to various phase values, including a phase of zero degree, 180 degrees or a multiple of 180 degrees, 90 degrees or a multiple of 90 degrees at an operating signal frequency. A CRLH structure can also be designed to support two or more frequency bands or broad band operations. CRLH MTM structures can be used in PA systems to provide multi-band operation, high efficiency, variable output power, and compact form factor while complying with matching conditions. Examples in this document include (1) power amplifier designs multiple PA systems such as Doherty PA architectures using the MTM technology in various configurations such as single band MTM PA systems, multi-band MTM PA systems, MTM Wilkinson or MTM power combiners and splitters, and MTM Inverted Doherty PA; (2) envelope elimination restoration (EER) PA systems including EER PAs that drive drain bias of an MTM PA and mix digital signals before feeding an MTM PA; (3) MTM balanced PA systems in multi-band and broadband configurations; and (4) MTM Linear Amplification using Non-linear Components (LINO).

A pure Left Handed (LH) material follows the left hand rule for the vector trio (E,H,β), and the phase velocity direction is opposite to the signal energy propagation. Both the permittivity and permeability of the LH material are negative. A Composite Right/Left Handed (CRLH) metamaterial can exhibit both left hand and right hand electromagnetic modes of propagation depending on the regime or frequency of operation. Under certain circumstances, a CRLH metamaterial can exhibit a non-zero group velocity when the wavevector of a signal is zero. This situation occurs when both left hand and right hand modes are balanced. In an unbalanced mode, there is a bandgap in which electromagnetic wave propagation is forbidden. In the balanced case, the dispersion curve does not show any discontinuity at the transition point of the propagation constant β (ω$_o$)=0 between the Left and Right handed modes, where the guided wavelength is infinite λ$_g$=2π/|β|→∞ while the group velocity is positive:

$$v_g = \frac{d\omega}{d\beta}\bigg|_{\beta=0} > 0 \qquad (1)$$

This state corresponds to the Zeroth Order mode m=0 in a Transmission Line (TL) implementation in the LH region. The CRHL structure supports a fine spectrum of low frequencies with a dispersion relation that follows the negative β parabolic region which allows a physically small device to be built that is electromagnetically large with unique capabilities in manipulating and controlling near-field radiation patterns. When this TL is used as a Zeroth Order Resonator (ZOR), it allows a constant amplitude and phase resonance across the entire resonator. The ZOR mode may be used to build MTM-based power combiners and splitters or dividers, directional couplers, matching networks, and leaky wave antennas. Examples of MTM-based power combiners and dividers are described below.

In RH TL resonators, the resonance frequency corresponds to electrical lengths $\theta_n = \beta_n l = m\pi$ ($m=1, 2, 3, \ldots$), where l is the length of the TL. The TL length should be long enough to reach low and wide spectrum of resonant frequencies. The operating frequencies of a pure LH material are at low frequencies. A CRLH metamaterial structure is very different from RH and LH materials and can be used to reach both high and low spectral regions of the RF spectral ranges of RH and LH materials. In the CRLH case, $\theta_m = \beta_n l = m\pi$, where l is the length of the CRLH TL and the parameter $m=0, \pm 1, \pm 2, \pm 3, \ldots, \pm\infty$.

FIG. 1A illustrates an equivalent circuit of an MTM transmission line 101 with unit cell 103 in which different unit cells can be connected together in series in a periodic configuration. The equivalent circuit for each unit cell 103 has a right-handed (RH) series inductance $L_R$, a shunt capacitance $C_R$ and a left-handed (LH) series capacitance $C_L$, and a shunt inductance $L_L$. The shunt inductance $L_L$ and the series capacitance $C_L$ are structured and connected to provide the left handed properties to the unit cell 103. This CRLH TL can be implemented by using distributed circuit elements, lumped circuit elements or a combination of both. Each unit cell 101 is smaller than $\lambda/10$ where $\lambda$ is the wavelength of the electromagnetic signal that is transmitted in the CRLH TL. CRLH TLs possess interesting phase characteristics such as antiparallel phase, group velocity, non-linear phase slope and phase offset at zero frequency.

Figure 1B:
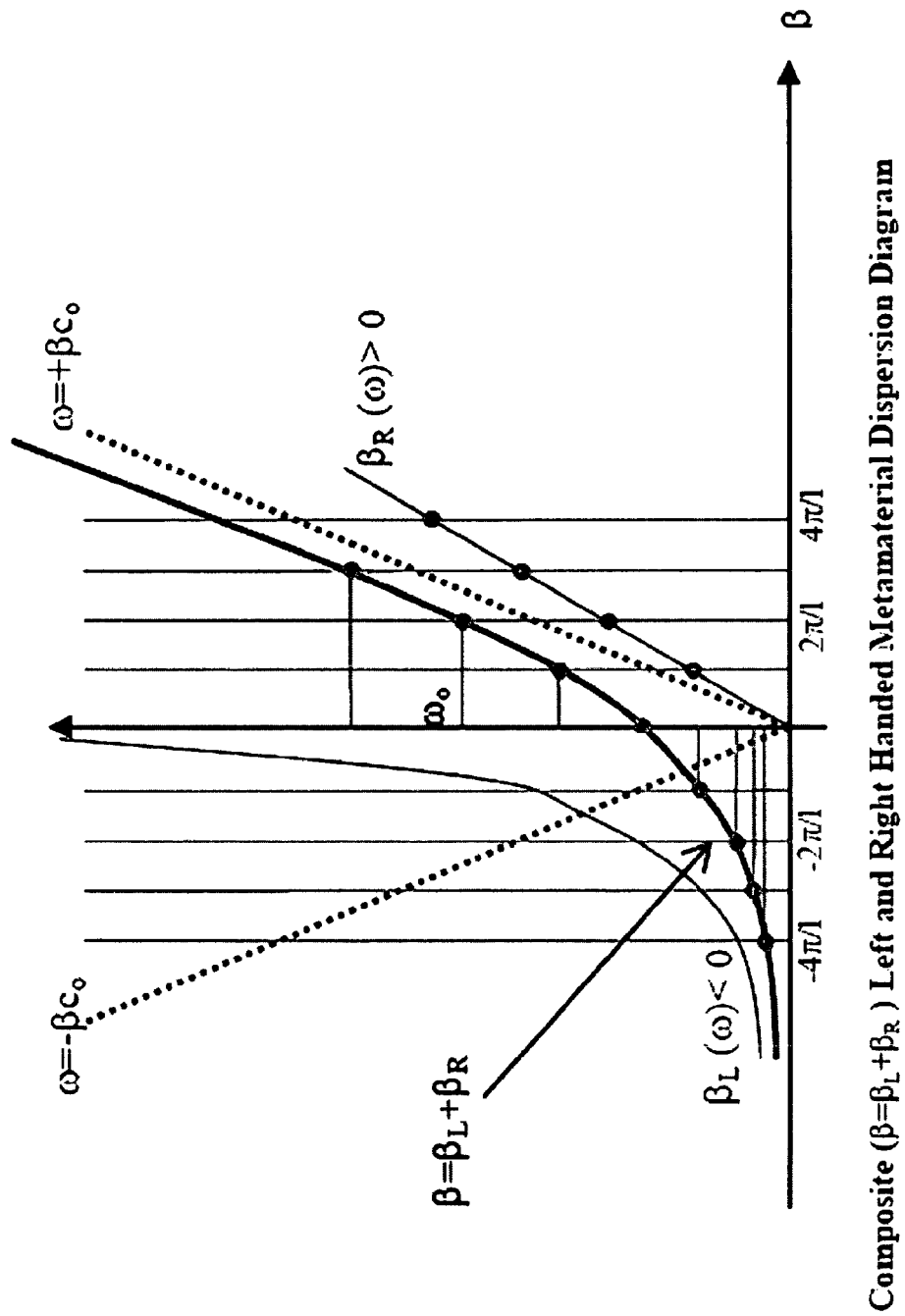
FIG. 1B illustrates a Dispersion Diagram of Balanced CRLH Metamaterial.

FIG. 1B shows the dispersion diagram of a balanced CRLH metamaterial with the unit cell in FIG. 1A. The CRLH structure can support a fine spectrum of low frequencies and produce higher frequencies including the transition point with m=0 that corresponds to infinite wavelength. This can be used to provide integration of CRLH antenna elements, such as but not limited to directional couplers, matching networks, amplifiers, filters, and power combiners and splitters. In some implementations, RF or microwave circuits and devices may be made of a CRLH MTM structure, such as but not limited to directional couplers, matching networks, amplifiers, filters, and power combiners and splitters.

Referring back to FIG. 1A, in the unbalanced case where $L_R C_L \neq L_L C_R$, two different resonant frequencies exist: $\omega_{se}$ and $\omega_{sh}$ that can support an infinite wavelength given by equations:

$$\omega_{sh} = \frac{1}{\sqrt{C_R L_L}} \tag{2}$$

$$\omega_{se} = \frac{1}{\sqrt{C_L L_R}}. \tag{3}$$

At $\omega_{se}$ and $\omega_{sh}$ the group velocity ($v_g = d\omega/d\beta$) is zero and the phase velocity ($v_p = \omega/\beta$) is infinite. When the series and shunt resonances are equal, i.e., $L_R C_L = L_L C_R$, the structure is said to be balanced, and the resonant frequencies coincide:

$$\omega_{se} = \omega_{sh} = \omega_0 \tag{4}$$

For the balanced case, the phase response can be approximated by the following equations:

$$\varphi_C = \varphi_{RH} + \varphi_{LH} = -\beta l = -\frac{Nl\omega}{c} \tag{5}$$

$$\varphi_{RH} \approx -N 2\pi f \sqrt{L_R C_R} \tag{6}$$

$$\varphi_{LH} \approx \frac{N}{2\pi f \sqrt{L_L C_L}} \tag{7}$$

where N is the number of unit cells. The slope of the phase is given by equation:

$$\frac{d\varphi_{CRLH}}{df} = -N 2\pi \sqrt{L_R C_R} - \frac{N}{2\pi f^2 \sqrt{L_L C_L}} \tag{8}$$

The characteristic impedance is given by equation:

$$Z_o^{CRLH} = \sqrt{\frac{L_R}{C_R}} = \sqrt{\frac{L_L}{C_L}}. \tag{10}$$

The inductance and capacitance values may be selected and controlled to create a desired slope for a chosen frequency. In addition, the phase may be set to have a positive phase offset at DC. These two factors are used to provide the designs of multi-band and other MTM power combining and dividing structures presented herein.

The following sections provide examples of determining MTM parameters of multi-band mode MTM structures, and similar techniques can be used to determine MTM parameters with three or more bands.

In a multi-band MTM structure, the signal frequencies $f_1$, $f_2$ for the two bands are first selected for two different phase values: $\phi_1$ at $f_1$ and $\phi_2$ at $f_2$. In this example, let N be the number of unit cells in the CRLH TL and $Z_t$, the characteristic impedance. The values for parameters $L_R$, $C_R$, $L_L$ and $C_L$ can be calculated as:

$$L_R = \frac{Z_t \left[\phi_1 \left(\frac{\omega_1}{\omega_2}\right) - \phi_2\right]}{N\omega_2 \left[1 - \left(\frac{\omega_1}{\omega_2}\right)^2\right]} \quad C_R = \frac{\phi_1 \left(\frac{\omega_1}{\omega_2}\right) - \phi_2}{N\omega_2 Z_t \left[1 - \left(\frac{\omega_1}{\omega_2}\right)^2\right]} \tag{11}$$

$$L_L = \frac{N Z_t \left[1 - \left(\frac{\omega_1}{\omega_2}\right)^2\right]}{\omega_1 \left[\phi_1 - \left(\frac{\omega_1}{\omega_2}\right)\phi_2\right]} \quad C_L = \frac{N \left[1 - \left(\frac{\omega_1}{\omega_2}\right)^2\right]}{\omega_1 Z_t \left[\phi_1 - \left(\frac{\omega_1}{\omega_2}\right)\phi_2\right]} \tag{12}$$

$$Z_0^{CRLH} = \sqrt{\frac{L_R}{C_R}} = \sqrt{\frac{L_L}{C_L}}. \tag{13}$$

In the unbalanced case, the propagation constant is given by equation:

$$\beta = s(\omega)\sqrt{\omega^2 L_R C_R + \frac{1}{\omega^2 L_L C_L} - \left(\frac{L_R}{L_L} + \frac{C_R}{C_L}\right)} \quad (14)$$

where $$s(\omega) = \begin{cases} -1 & \text{if } \omega < \min(\omega_{se}, \omega_{sh}): \text{ LH range} \\ +1 & \text{if } \omega > \max(\omega_{se}, \omega_{sh}): \text{ RH range} \end{cases} \quad (15)$$

For the balanced case:

$$\beta = \omega\sqrt{L_R C_R} - \frac{1}{\omega\sqrt{L_L C_L}} \quad (16)$$

A CRLH TL has a physical length of d with N unit cells each having a length of p: d=N.p. The signal phase value is φ=−βd. Therefore, $$\beta = -\frac{\phi}{d} \quad (17)$$

$$\beta_1 = -\frac{\phi_i}{(N.p)} \quad (18)$$

It is possible to select two different phases $\phi_1$ and $\phi_2$ at two different frequencies f1 and f2, respectively:

$$\begin{cases} \beta_1 = \omega_1 \sqrt{L_R C_R} - \frac{1}{\omega_1 \sqrt{L_L C_L}} \\ \beta_2 = \omega_2 \sqrt{L_R C_R} - \frac{1}{\omega_2 \sqrt{L_L C_L}} \end{cases} \quad (19)$$

In comparison, a non-MTM RH microstrip transmission line exhibits the following dispersion relationship:

$$\beta_n = \beta_0 + \frac{2\pi}{p} n, \; n = 0, \pm 1, \pm 2, \ldots \quad (20)$$

See, for example, the description on page 370 in Pozar, "Microwave Engineering," 3rd Edition and page 623 in Collin, "Field Theory of Guided Waves," Wiley-IEEE Press; 2nd Edition (Dec. 1, 1990).

Multi-band CRLH TL devices can be designed based on a matrix approach described in U.S. patent application Ser. No. 11/844,982. Under this matrix approach, each 1D CRLH transmission line includes N identical cells with shunt ($L_L$, $C_R$) and series ($L_R$, $C_L$) parameters. These five parameters, i.e., ($L_L$, $C_R$), ($L_R$, $C_L$) and N identical cells, determine the N resonant frequencies and phase curves, corresponding bandwidth, and input/output TL impedance variations around these resonances.

The frequency bands are determined from the dispersion equation derived by letting the N CRLH cell structure resonate with nπ propagation phase length, where n=0, ±1, . . . ±(N−1). In other words, a zero and 2π phase resonances can be accomplished with N=3 CRLH cells. Furthermore, a tri-band power combiner and splitter can be designed using N=5 CRLH cells where zero, 2π, and 4π cells are used to define resonances.

The n=0 mode resonates at $\omega_0 = \omega_{SH}$, and higher frequencies are given by the following equation for the different values of M specified in Table 1:

For n > 0, (21)

$$\omega_{\pm n}^2 = \frac{\omega_{SH}^2 + \omega_{SE}^2 + M\omega_R^2}{2} \pm \sqrt{\left(\frac{\omega_{SH}^2 + \omega_{SE}^2 + M\omega_R^2}{2}\right)^2 - \omega_{SH}^2 \omega_{SE}^2}$$

Table 1 provides M values for N=1, 2, 3, and 4.

TABLE 1

| Resonances for N = 1, 2, 3 and 4 cells | | | | |
|---|---|---|---|---|
| N \ Modes | \|n\| = 0 | \|n\| = 1 | \|n\| = 2 | \|n\| = 3 |
| N = 1 | M = 0; $\omega_0 = \omega_{SH}$ | | | |
| N = 2 | M = 0; $\omega_0 = \omega_{SH}$ | M = 2 | | |
| N = 3 | M = 0; $\omega_0 = \omega_{SH}$ | M = 1 | M = 3 | |
| N = 4 | M = 0; $\omega_0 = \omega_{SH}$ | M = 2 − √2 | M = 2 | |

Figure 2:
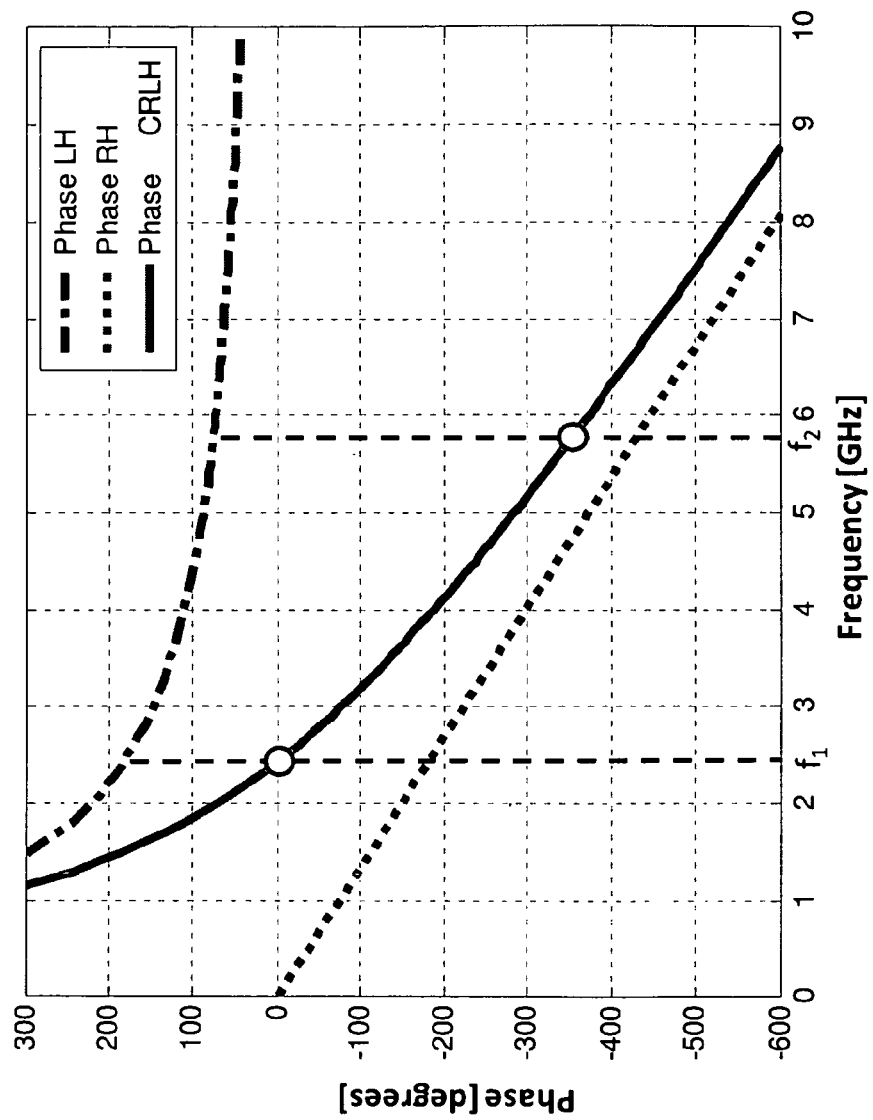
FIG. 2 illustrates a Multi-band Phase Response of LH, RH and CRLH TL, 0° @ f1 and −360° @ f2.

FIG. 2 shows an example of the phase response of a CRLH TL which is a combination of the phase of the RH components and the phase of the LH components. Phase curves for CRLH, RH and LH transmission lines are shown. The CRLH phase curve approaches the LH TL phase at low frequencies and approaches the RH TL phase at high frequencies. Notably, the CRLH phase curve crosses the zero-phase axis with a frequency offset from zero. This offset from zero frequency enables the CRLH curve to be engineered to intercept a desired pair of phases at any arbitrary pair of frequencies. The inductance and capacitance values of the LH and RH can be selected and controlled to create a desired slope with a positive offset at the zero frequency (DC). By way of example, FIG. 2 shows that the phase chosen at the first frequency $f_1$ is 0 degree, and the phase chosen at the second frequency $f_2$ is −360 degrees. In addition, a CRLH TL can be used to obtain an equivalent phase with a much smaller footprint than an RH transmission line.

Therefore, CRLH power combiners and dividers can be designed for combining and dividing signals at two or more different frequencies under impedance matched conditions to achieve compact devices that are smaller than conventional combiners and dividers. Referring back to FIG. 1A, each CRLH unit cell 103 can be designed based on different unit configurations in CRLH power combiners and dividers. The properties of the metamaterial offer new possibilities for different types of design for dual-frequencies but also for multi-band systems.

One example of a power amplifier system for amplifying an RF signal based on a CRLH MTM structure can be designed to include a power divider, multiple power amplifiers connected in parallel and a power combiner. Both or just one of the power divider and the power combiner can be a CRLH MTM structure to achieve certain technical features. In this system, an input port is provided to receive an input RF signal. The power divider includes (1) an input CRLH transmission line coupled to the input port to receive the input RF signal and (2) multiple output CRLH transmission lines that are coupled to the input CRLH transmission line to split the received input RF signal into different branches. The power amplifiers are coupled to the output branch transmission CRLH lines of the power divider, respectively. Each power amplifier receives and amplifies an RF signal to produce an amplified RF signal. The power combiner in this system includes multiple input CRLH transmission lines that are respectively coupled to the power amplifiers to receive amplified RF signals produced by the power amplifiers. Each input CRLH transmission line of the power combiner is connected to one power amplifier. This combiner also includes an output CRLH transmission line coupled to the input CRLH transmission lines to combine the received amplified branch RF signals into a combined output RF signal.

The above MTM-based multi-PA system can be implemented as a MTM-enhanced Doherty PA system. The Doherty technique may achieve high efficiency in the back-off region. Also, by using the property of the MTM, linearity may be enhanced. A non-MTM Doherty PA has a large size due to presence of quarter wavelength transformers designed on microstrip which support a single-band. MTM-enhanced Doherty PA can replace the single-band quarter wavelength transformers with multi-band MTM quarter wavelength transformers which are also more compact. The power splitter at the input can be implemented by a compact MTM multi-band power splitter. The input/output matching networks may be integrated in the power combiner for better efficiency. An N-way power combiner/splitter may be also used with each branch matched to the desired impedance. The use of MTM elements may increase the bandwidth of operation by being able to control the phase slope. In addition, the MTM properties may facilitate the connection of antennas with poor Voltage Standing Wave Ratio (VSWR), for example.

The power divider or combiner in the above MTM-based multi-PA system can be designed to include a first transmission line including a CRLH MTM structure and multiple second transmission lines of CRLH MTM structures that are coupled to one terminal of the first transmission line to either split an input RF signal received from the first transmission line into multiple output RF signals in the second transmission lines, respectively, when configured as a power divider, or, when configured as a power combiner, combine input RF signals in the second transmission lines into an output RF signal in the first transmission line. The first transmission line and the second transmission lines are structured to be in two configurations. In the first configuration, the first transmission line is a CRLH MTM transmission line of an electrical length having a phase delay of $\pm m 90°$ where m is a positive integer, and each of the second transmission lines is a CRLH MTM transmission line of an electrical length having a zero phase delay or a phase delay of $\pm n 180°$ where n is a positive integer. In the second configuration, the first transmission line is a CRLH MTM transmission line of an electrical length having a zero phase delay or a phase delay of $\pm m 180°$ where m is a positive integer and each of the second transmission lines is a CRLH MTM transmission line having a phase delay of $\pm n 90°$ where n is a positive integer. The transmission lines can be designed to have a single RF frequency or two or more different RF frequencies.

FIGS. 3A and 3B show examples of two different single band N-way MTM power combiner/splitters. These two MTM power combiner/splitters can be designed to achieve a more compact package with respect to non-MTM power combiner/splitters.

In one implementation shown in FIG. 3A, each of the quarter wavelength ($\phi_{12}$) CRLH-TLs 301 are connected at one end to its corresponding impedance 303, and at the other end to a zero degree ($\phi_{11}$) CRLH-TL 305. The phase $\phi_n$ is the phase delay caused by the electrical length and is at $0°$, $\pm 180°$, $\pm 360°$, ..., or a multiple of $180°$ (i.e., $n180°$ where n is a positive or negative integer), and the phase $\phi_{12}$ is the phase delay caused by the electrical length and is at $\pm 90°$, $\pm 270°$, ... or a multiple of $90°$ ($n90°$ where n is a positive or negative odd integer). In this application, the "quarter wavelength" refers to an odd multiple of a quarter wavelength, i.e. $(2n+1)\times\lambda/4$, where $n=1, 2, 3 \ldots$. As illustrated, the quarter wavelength ($\phi_{12}$) CRLH-TLs 301 terminated at their respective impedances $Z_1, Z_2, \ldots$ and $Z_N$.

The quarter wavelength ($\phi_{12}$) CRLH-TLs 301 and the zero-degree ($\phi_{11}$) CRLH-TL 305 are designed to provide impedance matching between each of the impedances $Z_1, Z_2, \ldots$ and $Z_N$ to the impedance 307 (which can be, e.g., 50 Ohms as shown) at the terminal end of the zero-degree ($\phi_{11}$) CRLH-TL 305. In this regard, each of the quarter wavelength ($\phi_{12}$) CRLH-TLs is used to transform the corresponding impedance to match the impedance 307 (e.g., 50 ohms as shown). The number of ports, N, may be selected based on the requirement of a specific application. In the implementation shown in FIG. 3A, the zero degree ($\phi_{11}$) CRLH-TL 305 is connected between the impedance 307 at one terminal end of the CRLH-TL 305 and the quarter wavelength ($\phi_{12}$) CRLH-TLs 301 at the other terminal end of the CRLH-TL 305. In another implementation, the quarter wavelength ($\phi_{12}$) CRLH-TLs 301 may be connected directly to the 50-ohm impedance 307 without the zero degree ($\phi_{11}$) CRLH-TL 305. For the example of the impedance 307 at 50 ohm, the impedance of each quarter wavelength CRLH-TL 301 is determined by $$Z_0 = \sqrt{(50 * Z_J * N)},$$

where $J=1, \ldots,$ or N, in either configuration.

FIG. 3B shows another implementation in which each of the zero degree ($\phi_{11}$) CRLH-TLs 321 is connected at one end to an impedance $Z_1$ 323 and at the other end to a quarter wavelength ($\phi_{12}$) CRLH-TL 325. N number of the impedances with the same value $Z_1$ 323 connected in parallel are transformed to 50 ohms 327 by the quarter wavelength ($\phi_{12}$) CRLH-TL 325. For the example of the impedance 327 at 50 ohm, the impedance of the quarter wavelength ($\phi_{12}$) CRLH-TL 325 is determined by $$Z_0 = \sqrt{\left(50 * Z_1 * \frac{1}{N}\right)}$$

FIGS. 4A and 4B presents two examples of multi-band N-way MTM power combiner/splitters which may be used to combine or split the power in the Doherty architecture or other PA architectures.

In the implementation shown in FIG. 4A, each of quarter wavelength ($\phi_{12}, \phi_{22}$) CRLH-TLs 401 may be connected at one end to its corresponding impedance 403, i.e. one of $Z_1, Z_2, \ldots$ and $Z_N$, and at the other end to a zero degree ($\phi_{11}, \phi_{21}$) CRLH-TL 405, where both $\phi_{11}$ and $\phi_{21}$ are set to be any one of $0°, \pm 180°, \pm 360°, \ldots \pm n180°$ (n is a positive or negative integer). Both $\phi_{12}$ and $\phi_{22}$ are set to be any of $\pm 90°, \pm 270°, \ldots \pm (2n+1)90°$ where n is a positive or negative integer and $(2n+1)$ is an odd integer. At one frequency $f_1$, each quarter wavelength ($\phi_{12}, \phi_{22}$) CRLH-TL 401 provides a phase of $\phi_{12}$, and at another frequency $f_2$ it provides a phase of $\phi_{22}$. The zero degree ($\phi_{11}, \phi_{21}$) CRLH-TL 405 has a phase of $\phi_{11}$ at the frequency $f_1$ and a phase of $\phi_{21}$ at the other frequency $f_2$. Each of the quarter wavelength ($\phi_{12}, \phi_{22}$) CRLH-TLs 401 is used to transform the corresponding impedance to 50 ohms 407, where the number of ports, N, can be arbitrary. The impedance of each quarter wavelength CRLH-TL 401 is determined by $Z_0=\sqrt{(50*Z_j*N)}$, j=1, . . . , or N, for both $\phi_{12}$ and $\phi_{22}$.

In another implementation shown in FIG. 4B, each of zero degree ($\phi_{11}$, $\phi_{21}$) CRLH-TLs 421 may be connected at one end to an impedance $Z_1$ 423 and at the other end to a quarter wavelength ($\phi_{12}$, $\phi_{22}$) CRLH-TL 425. N number of the impedances with the same value $Z_1$ 423 connected in parallel are transformed to 50 ohms 427 by the quarter wavelength ($\phi_{12}$, $\phi_{22}$) CRLH-TL 425. The impedance of the quarter wavelength ($\phi_{12}$, $\phi_{22}$) CRLH-TL 425 is determined by $$Z_0 = \sqrt{\left(50*Z_1*\frac{1}{N}\right)}$$

for both $\phi_{12}$ and $\phi_{22}$.

In yet another implementation, the series capacitor CL in the equivalent circuit shown in FIG. 1A may be replaced with a varactor. The bias of the varactor is adjusted in order to control the impedance matching of the CRLH-TL to compensate for the impedance change depending on the number of multiple CRLH-TLs that are operating in the "ON" state.

Wilkinson power combiners and splitter can also be designed based on MTM structures. A Wilkinson power splitter, for example, can include a first CRLH MTM transmission line as the input transmission line of the power splitter, a second CRLH MTM transmission line as one of the branch output transmission lines of the power splitter to have a first terminal coupled to the first CRLH MTM transmission line and a second terminal. A third CRLH MTM transmission line is provided as another one of the branch output transmission lines to have a first terminal coupled to the first CRLH MTM transmission line and a second terminal. A resistor is coupled as a bridge between the second and third CRLH MTM transmission lines by coupling its first terminal to the second terminal of the second CRLH MTM transmission line and by coupling its second terminal to the second terminal of the third CRLH MTM transmission line. This Wilkinson power splitter also includes a fourth CRLH MTM transmission line coupled to the second terminal of the third CRLH MTM transmission line and a fifth CRLH MTM transmission line coupled to the second terminal of the third CRLH MTM transmission line. The fourth and fifth transmission lines provide the outputs of the Wilkinson power splitter.

A Wilkinson power combiner is a reversed design of the power splitter. Such a combiner is placed downstream from power amplifiers to receive the outputs of the power amplifiers. In the example of two power amplifiers, the combiner can include a first CRLH MTM transmission line having a first terminal coupled to a first power amplifier to receive a first amplified RF signal and a second terminal to output the first amplified RF signal, and a second CRLH MTM transmission line having a first terminal coupled to a second power amplifier to receive a second amplified RF signal and a second terminal to output the second amplified RF signal. A resistor is provided to have its first terminal coupled to the second terminal of the first CRLH MTM transmission line and its second terminal coupled to the second terminal of the second CRLH MTM transmission line. In addition, a third CRLH MTM transmission line is coupled to the second terminal of the first CRLH MTM transmission line and a fourth CRLH MTM transmission line is coupled to the second terminal of the fourth CRLH MTM transmission line. The combiner further includes a fifth CRLH MTM transmission line forming the output transmission line and coupled to the third and fourth CRLH MTM transmission lines to combine their outputs into a single output.

Figure 5A:
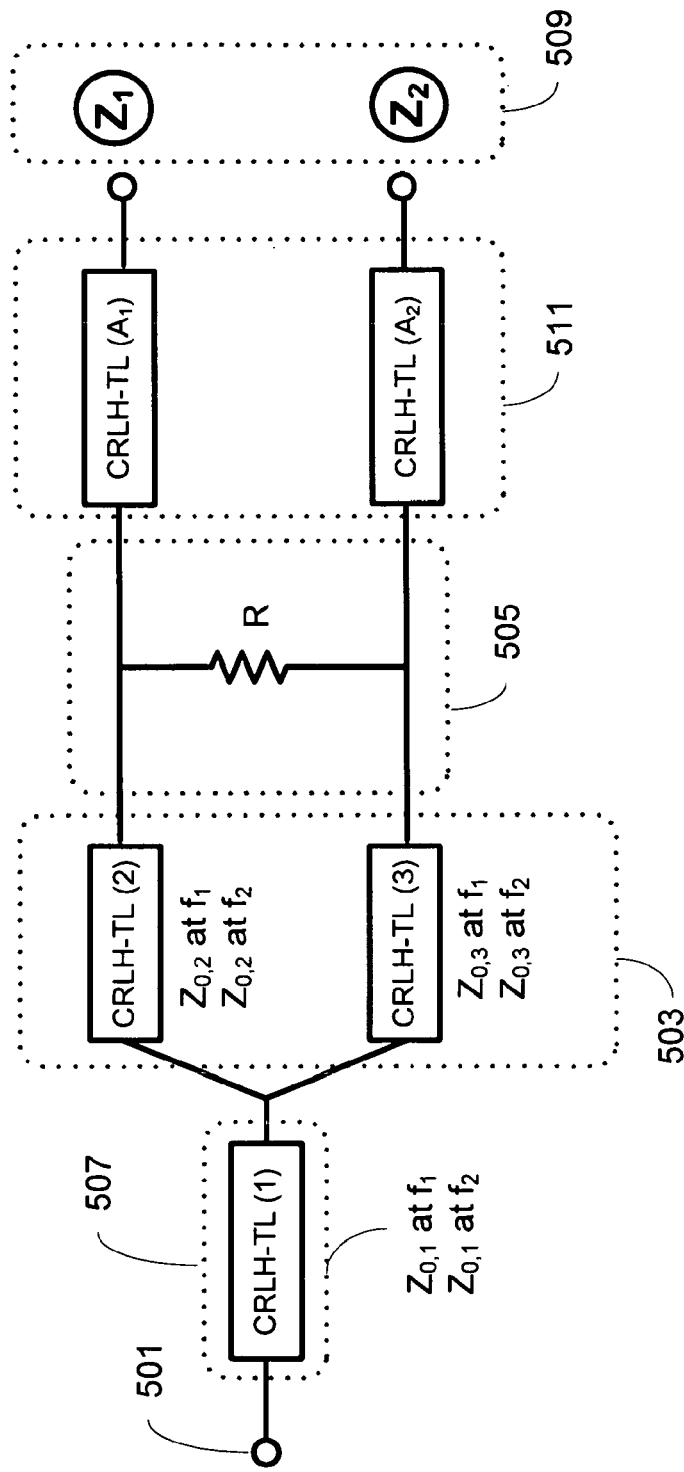
FIG. 5A illustrates a multi-band 2-Way MTM Wilkinson Power Splitter/Combiner.

FIG. 5A shows an example of a 2-Way MTM Wilkinson Power Splitter/Combiner. In this implementation, a multi-band input RF signal is received at an input port 501 having frequencies $f_1$ and $f_2$, for example. The RF input signal may be unevenly or evenly divided into two branches. Each CRLH-TLs 503 may be connected at one end to its corresponding resistor 505, i.e. one of R, and at the other end to a CRLH-TL 507, where the impedance of each CRLH-TL 503 is determined by the impendence $Z_{0,1}$ from the following equations:

$k^2=P_3/P_2$, where k is the ratio of predetermined uneven powers, $P_2$ and $P_3$, at outputs port 2 and port 3, respectively, $Z_{0,3}=Z_{0,1}\sqrt{(1+k^2)/k^3}$, $Z_{0,3}=Z_{0,1}\sqrt{(1+k^2)/k^3}$ $Z_{0,2}=K^2Z_{0,3}$, and $R=Z_{0,1}(k+1/k)$ The two impedances with the value $Z_{0,2}$ and $Z_{0,3}$ corresponding to each CRLH-TLs 503 are transformed to 50 ohms 509 by corresponding CRLH-TLs 511.

Figure 5B:
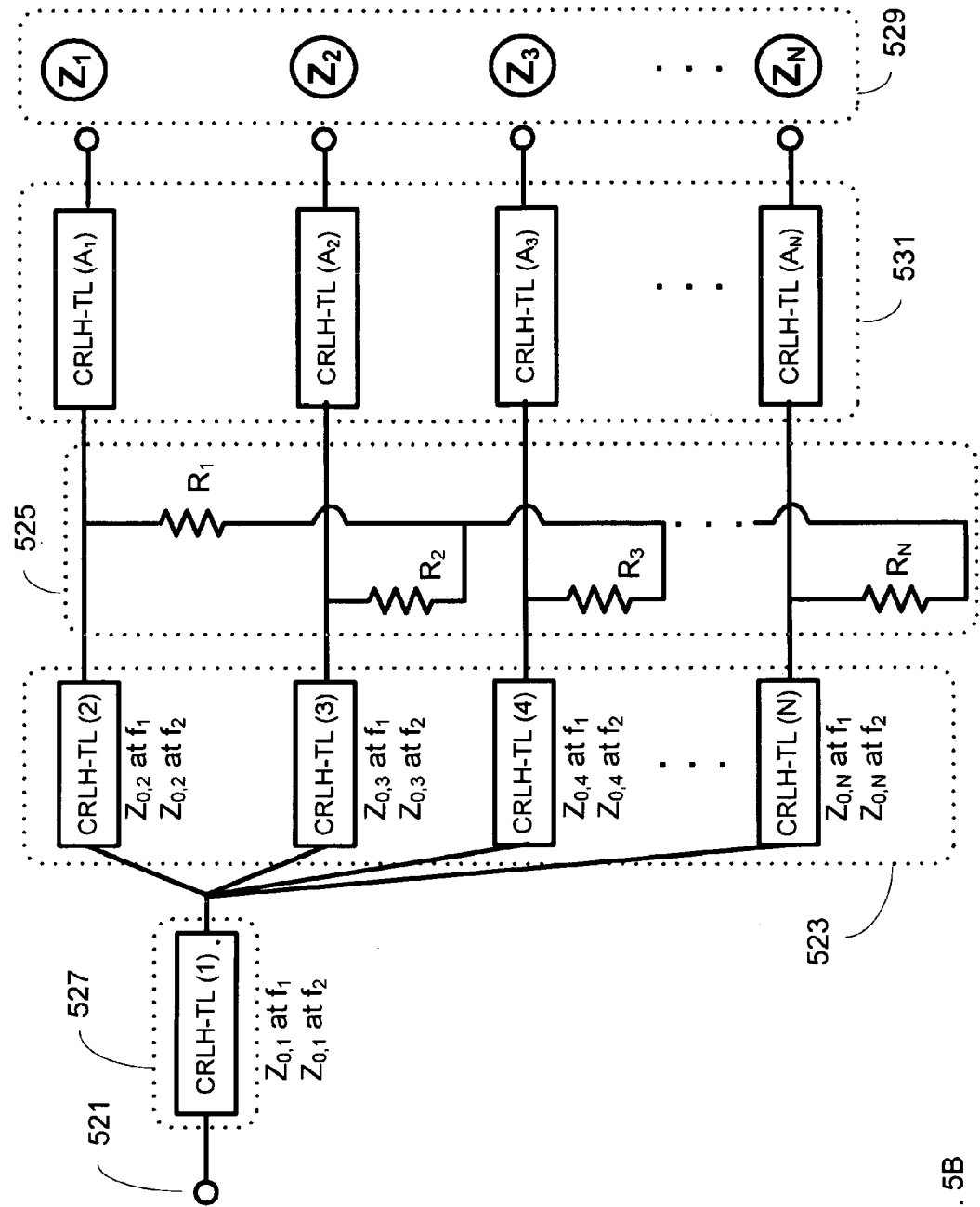
FIG. 5B illustrates a multi-band N-Way MTM Wilkinson Power Splitter/Combiner.

FIG. 5B illustrates an implementation of an N-Way MTM Wilkinson Power Splitter/Combiner. In this implementation, a multi-band input RF signal is received at an input port 521 having frequencies $f_1$ and $f_2$, for example. The RF input signal may be unevenly or evenly divided into N branches. Each CRLH-TLs 523 can be connected at one end to its corresponding resistor 525, i.e. one of $R_1$, $R_2$, . . . and $R_N$, and at the other end to a CRLH-TL 527, where the impedance of each CRLH-TL 523 is determined by the input impendence $Z_{0,1}$. The other end of each corresponding resistor 525 is connected to each other to form a single connection between all N resistors in this Wilkinson design. In this example, the N impedances with the value $Z_{0,N}$ corresponding to each CRLH-TLs 523 can be transformed to the impedance 529 (which can be, e.g., 50 ohms) by the corresponding CRLH-TLs 531.

Figure 6A:
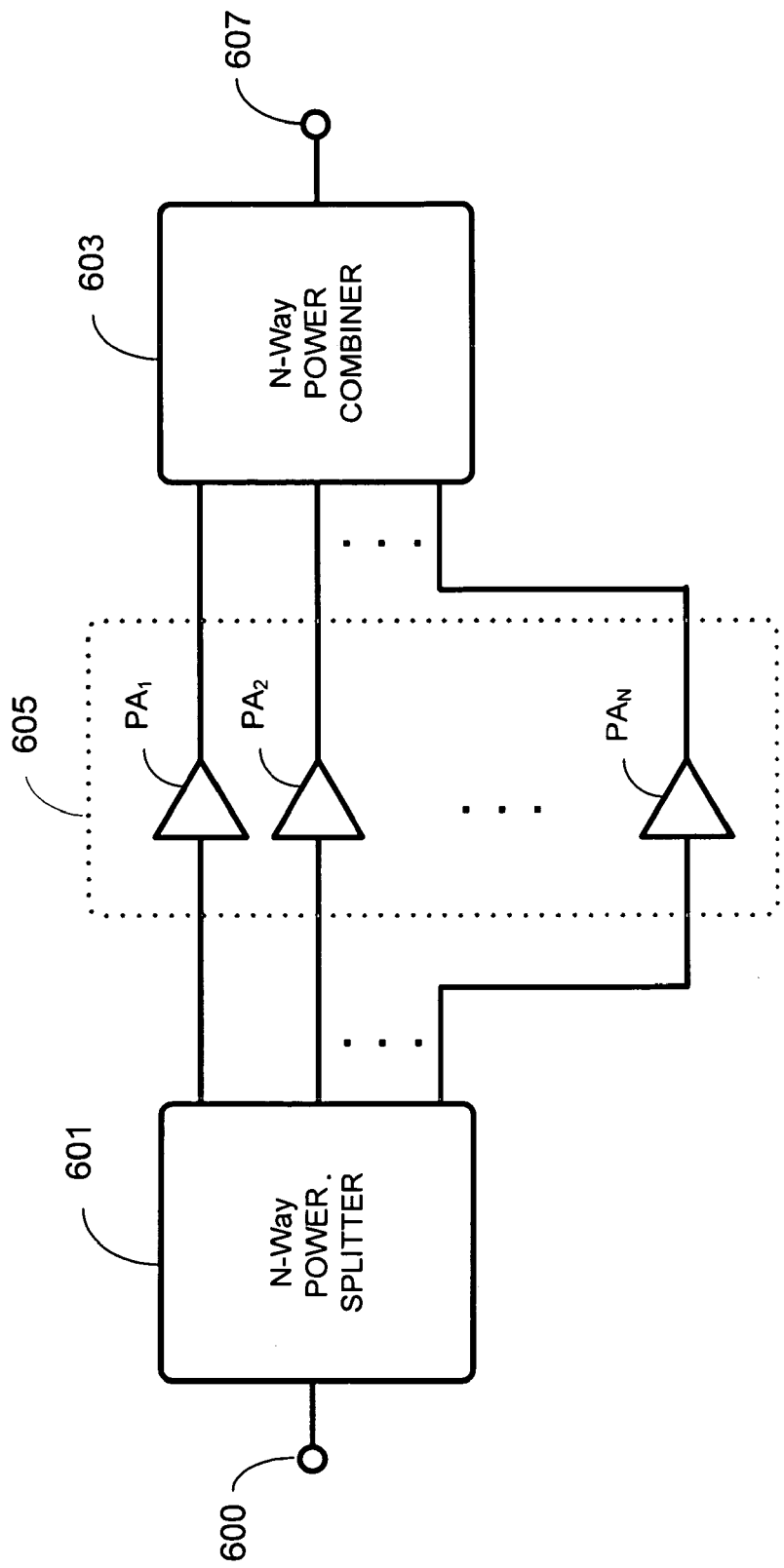
FIG. 6A illustrates a general case of a PA with a Power Splitter and a Power Combiner.

Based on the above MTM-based power combiners or splitters, FIG. 6A shows an example of a single or multi-band PA system comprising an N-way power splitter 601 and an N-way power combiner 603. At least one of the devices 601 and 603 is based a CRLH MTM design. In operation, the PA system amplifies the low input power of the RF signal received at an input port into higher levels of RF output power transmitted at an output port by converting DC power into RF power. For example, an input signal is received at the input port 600 coupled to an N-way Power Splitter 601 where the input signal is unevenly or evenly divided into N branches forming multiple output signals. Each output signals of the N-way Power Splitter A 601 is connected to the input of each $PA_n$ 605, where n=1, 2, . . . N. The output of each $PA_n$ 605 is connected to each input of an N-way Power Combiner 603, where n=1, 2, . . . N. The output of the N-way Power Combiner 603 transmits the amplified combined input signal to an output port 607.

Various implementations of the PA-Power Splitter/Combiner system described above and shown in FIG. 6A can be made. For example, an MTM power splitter can be used in FIG. 6A to reduce the size and, thus, integrate the PA system on a microchip depending on the substrate. The MTM structures can be used to enable multi-band operations. The MTM application described for the power splitter can be applied to the power combiner at the output of the system resulting in similar sizing benefits and multi-band properties.

The exemplary systems described in this document can utilize PAs such as Doherty PAs, Balanced PAs (e.g., MTM Balanced PAs and non-MTM Balanced PAs), and other MTM and non-MTM PAs. Various types and combinations of N-way splitters and N-way combiners may be implemented in the PA system shown in FIG. 6A. For example, each N-way Power Splitter 601 and N-way combiner 603 may be formed from MTM or conventional structures. Examples of the various combinations of N-way Power Splitter 601 and N-way Power Combiner 603 shown in FIG. 6A may include conventional splitters/MTM combiners, MTM splitters/conventional combiners, and MTM splitters/MTM combiners. In addition, these systems may implement MTM and conventional structures operating in different frequency ranges or bands, e.g., one or more frequency bands.

The Doherty architecture can be implemented to include two power amplifiers that are evenly fed with input power and can be designed to operate in any of the classes such as class A/B/AB/C/D/E/F/F-1/J. It is possible to unevenly feed the Doherty PA by applying more power to the peak PA than to the carrier PA in order to fully modulate the load impedance. This results in more output power than the case in which the PAs are driven with the same amount of power.

Figure 6B:
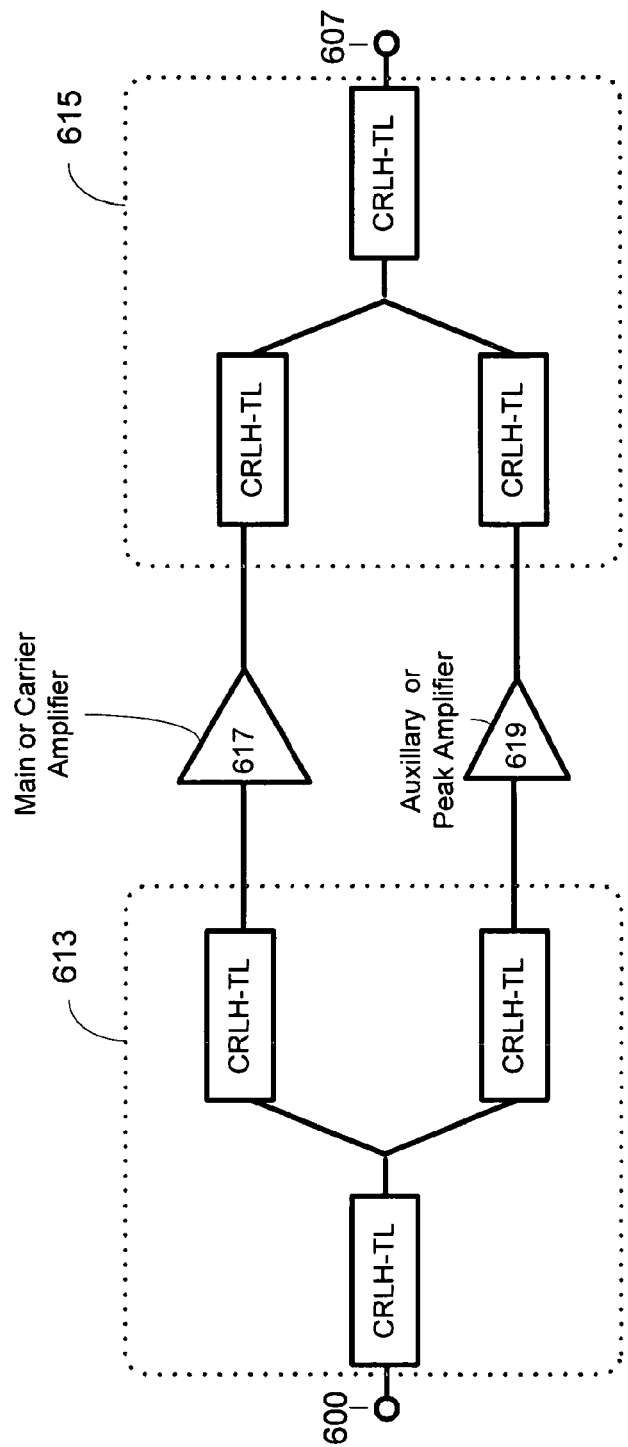
FIG. 6B illustrates an MTM Doherty PA and a 2-Way MTM Power Splitter and a 2-Way MTM Power Combiner.

FIG. 6B illustrates one implementation of the PA system presented in FIG. 6A. This MTM Doherty PA system includes two PAs, 617 and 619, coupled to a 2-way MTM power splitter 613 and a 2-way MTM power combiner 615 such as the 2-way MTM power combiners/splitters described in FIGS. 3A-3B and FIGS. 4A-4B. The two PAs comprises two power amplifiers: one "main PA" 617 or "carrier PA" and one "auxiliary PA" 619 or "peak PA". These MTM power combiners/splitters may have a small footprint and low losses, and, therefore, can enhance efficiency. In addition, these MTM power combiner/splitters may also support multi-band frequencies as described in the previous section and integrate input matching network (IMN) and/or output matching network (OMN).

Figure 6C:
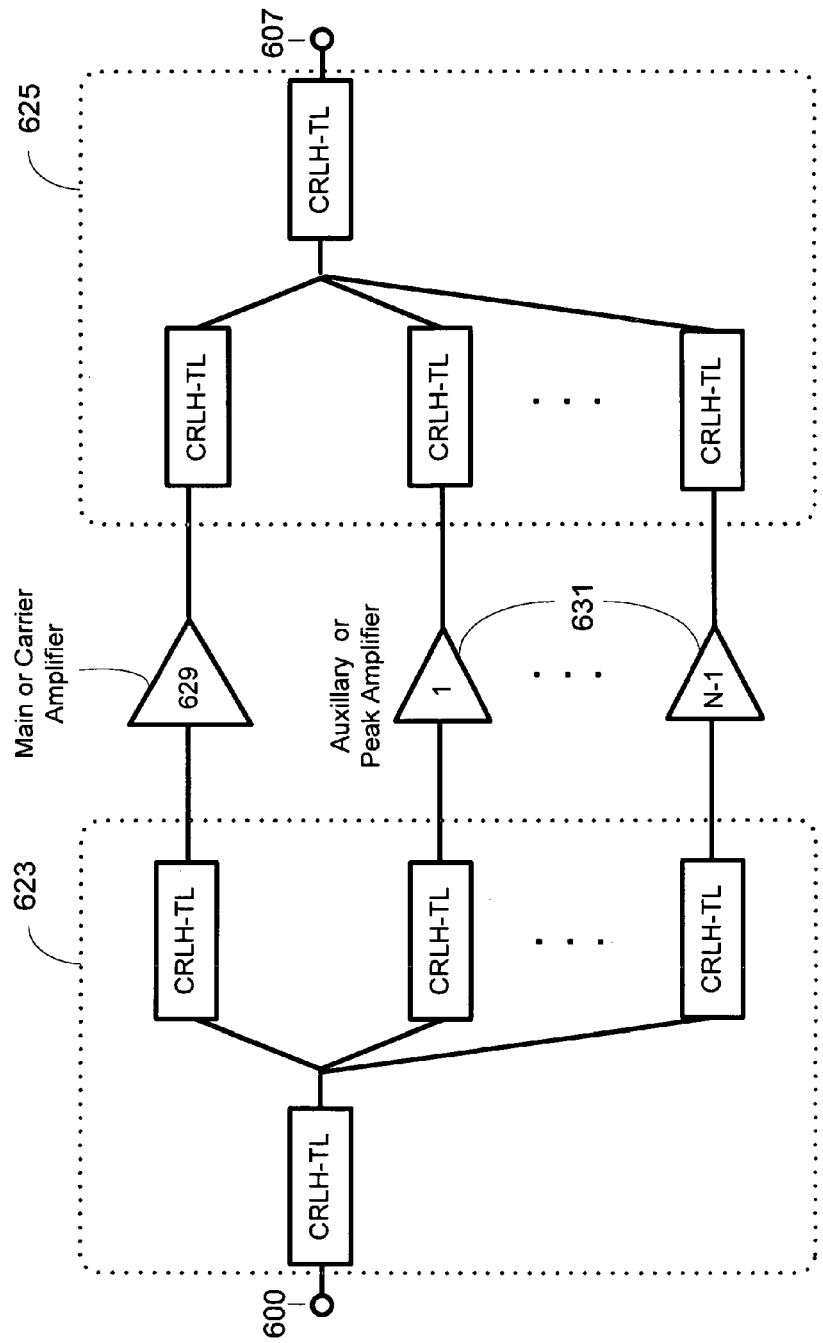
FIG. 6C illustrates an N-Way MTM Doherty PA, an N-Way MTM Power Splitter and an N-Way MTM Power Combiner.

FIG. 6C illustrates another implementation of the PA system presented in FIG. 6A. In FIG. 6C, an N-way MTM Doherty PA system is comprised of an N PAs 629, 631 coupled to an N-way MTM power splitter 623 at its input and an N-way MTM power combiner 625 at its output such as the N-way MTM power combiners/splitters described in FIGS. 3A-3B and FIGS. 4A-4B. In this example, the PAs are comprised of a single main or carrier amplifier 629 and (N−1) peak or auxiliary amplifiers 631. An N-way Doherty PA may have the ability to operate at a greater back-off while retaining high efficiency and high linearity. By applying the MTM technology to the Doherty PA system, the MTM Doherty PA system can be constructed in a compact form and have multi-band properties. When this architecture is unevenly driven, the output power of the system may be increased due to the unevenly driven split. For example, the auxiliary or (peak) amplifier 631, characterized by a switching amplifier, turns ON only when there is a certain power applied to the input of the switching amplifier 631. When the input power is low, the switching amplifier 631 is turned OFF. Therefore, by using unevenly driven splitters 623, the auxiliary amplifiers 631 can be turned ON earlier or later than in the evenly driven case. The impedance of each branch of the power splitter 623 may be matched by selecting the parameters that defines the CRLH and by design to the input impedance of the PA. The same is true for the power combiner 625 located at the output.

Each branch of the power combiner 625 may be matched to the output impedance of the PAs 629, 631. It is also possible to use a series 90° line at the output of each PAs 629-631 as described in FIG. 14. The only difference is the use of 90° and 270° instead of 0° and 360°.

In yet another implementation of a PA system presented in FIG. 6A, the N-way power splitter/combiner described in FIG. 6A can be replaced with a 2-way MTM Wilkinson splitter/combiner as described in FIG. 5A. However, the design may be extended to N-way splitter/combiners such as those described in FIGS. 4A-4B and based on the N-way MTM Wilkinson splitter/combiners described in FIG. 5B. Examples of various PA architectures that may use the 2-way MTM Wilkinson power splitter/combiners shown in FIG. 5A are illustrated in FIGS. 7-10 and are described herein as follows.

Figure 7:
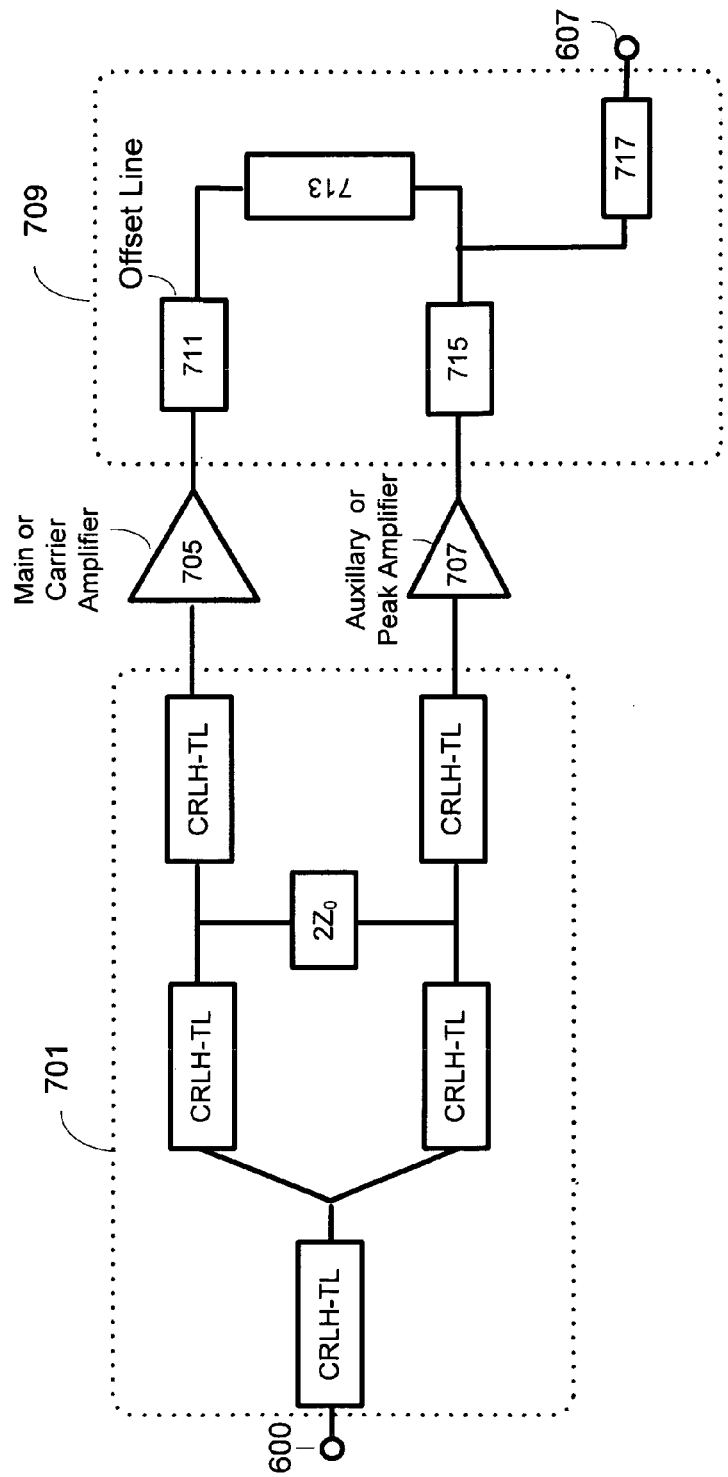
FIG. 7 illustrates an MTM Doherty PA with an MTM Wilkinson and conventional components.

In the MTM Doherty PA system shown in FIG. 7, the input stage of the MTM Doherty PA system may be comprised of a 2-way MTM Wilkinson splitter 701 as shown in FIG. 5A and described previously. In this implementation, the Wilkinson splitter may utilize an evenly divided splitter where k=1. Two PAs 705 and 707 are coupled to the output ports of the MTM Wilkinson splitter 701 in which the power is evenly divided into the input of a main amplifier 705 and the input of an auxiliary amplifier 707. Alternatively, each PA can be fed with an arbitrary amount of input power which can be designed by selectively choosing and splitting the input signal to the PAs 705, 707. The amplified signals from each amplifier 705, 707 are fed into a output power combiner 709 in which conventional RH components (713, and 717) can be used at the output stage of the PA system.

Figure 8:
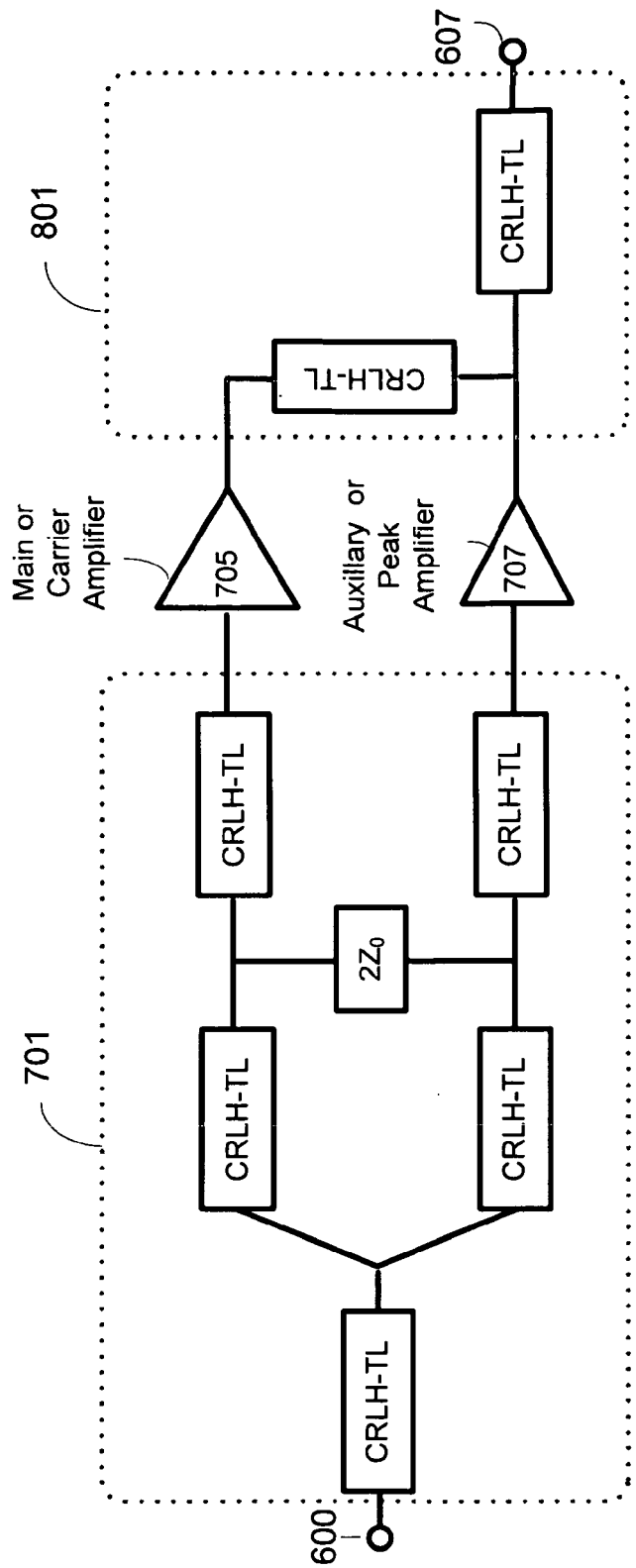
FIG. 8 illustrates an MTM Doherty PA and an MTM Wilkinson.

The MTM Doherty PA system in FIG. 8 utilizes the same splitter 701 and two PAs 705 and 707 shown in FIG. 7 and previously described. In this implementation, the output power combiner 709 can be replaced with an MTM output power combiner 801 comprised of CRLH-TLs. In contrast to the conventional case, the MTM components at the output stage offer an increased bandwidth of the Doherty amplifier due to a flatter phase slope.

Figure 9:
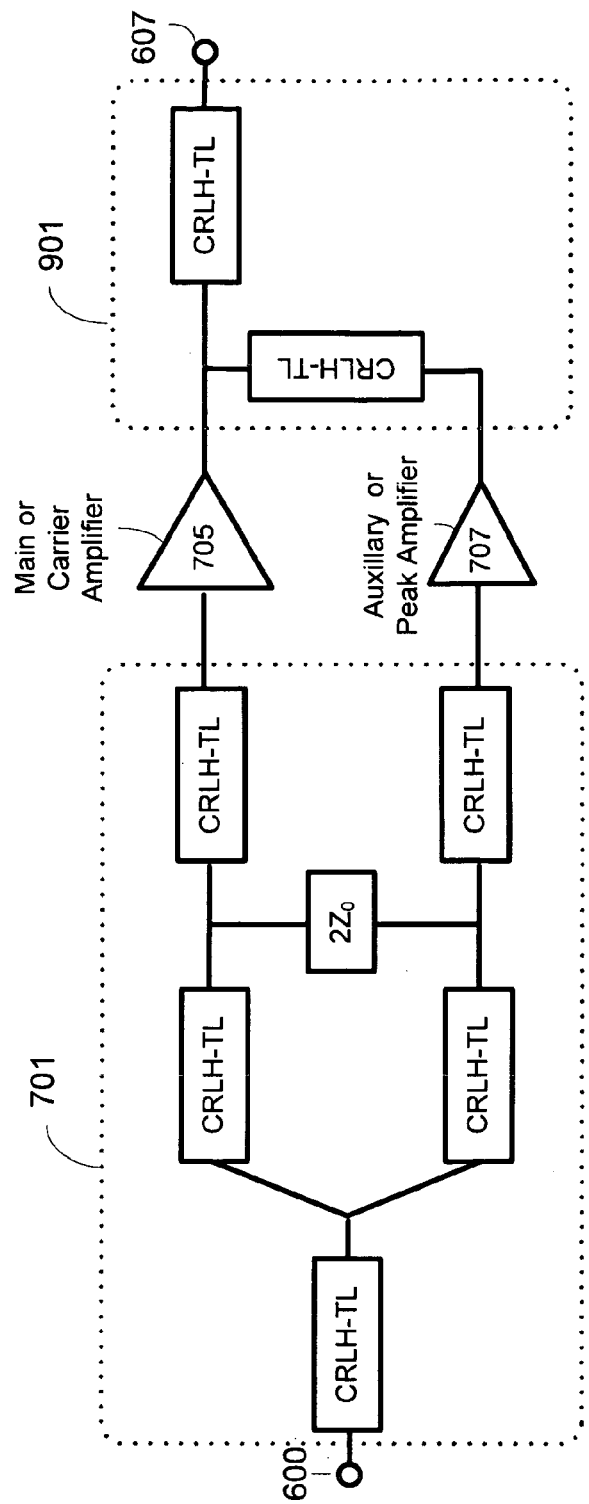
FIG. 9 illustrates an MTM Inverted Doherty PA and an MTM Wilkinson.

The MTM Doherty PA system in FIG. 9 also utilizes the same splitter 701 and two PAs 705 and 707 shown in FIG. 7 and previously described. In this implementation, the conventional RH components 709 having a phase of +90 degrees are replaced with MTM quarter wavelength components 901 at the output stage. The bandwidth of the inverted Doherty may also be increased as a result of the MTM components 901 supplied at the output stage.

Figure 10:
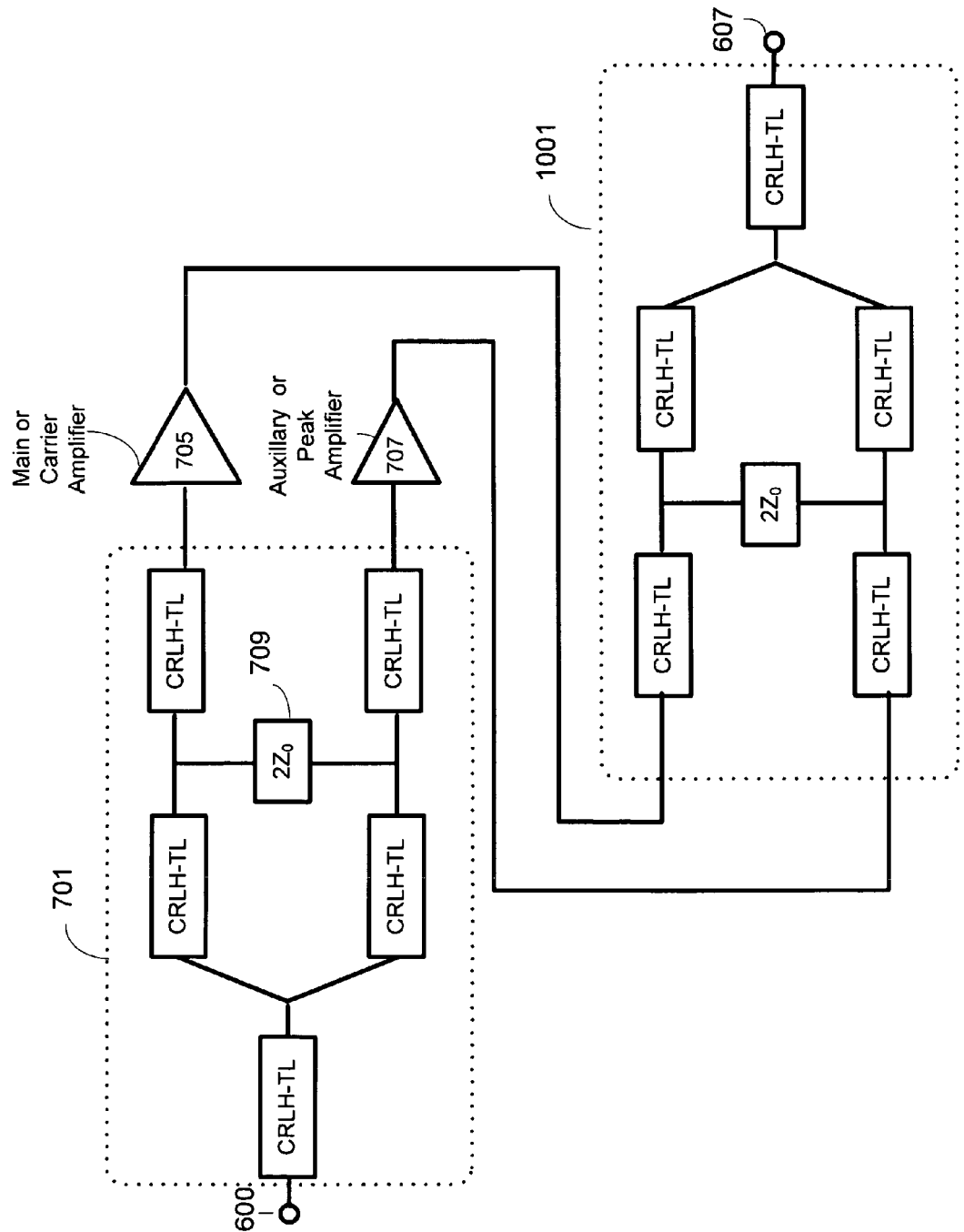
FIG. 10 illustrates an MTM Doherty PA and Two MTM Wilkinsons.

In another implementation, the MTM Doherty PA system shown in FIG. 10 is comprised of the same MTM Wilkinson splitter 701 and two PAs 705 and 707 shown in FIG. 7 and previously described. In this configuration, a signal from the main amplifier 705 and another signal from the auxiliary amplifier 707 are coupled and fed to corresponding input ports of a MTM Wilkinson combiner 1001.

Figure 11A:
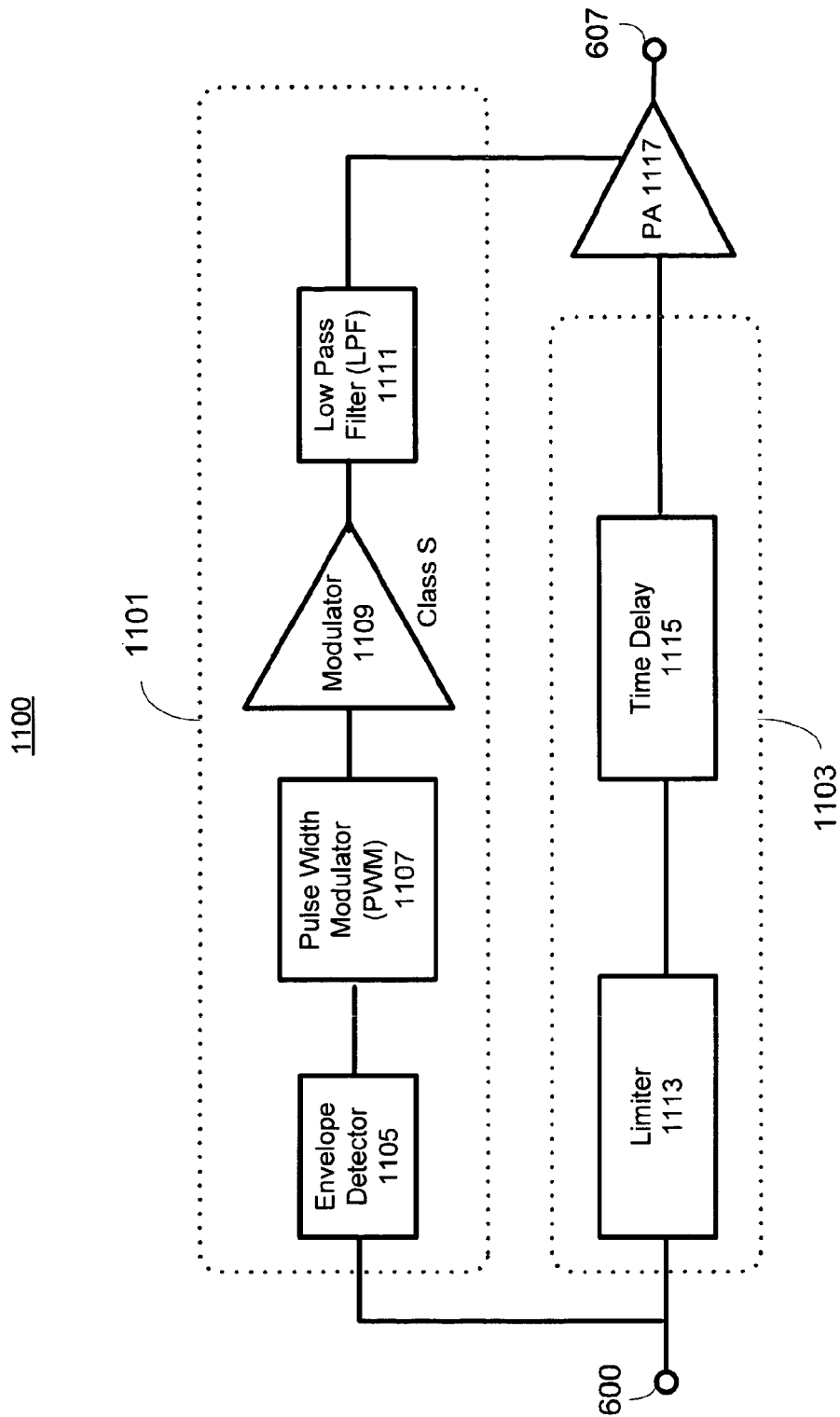
FIG. 11A illustrates an Envelope Elimination and Restoration (EER) architecture.

One technique to build power amplifiers with enhanced efficiency and linearity is known as the Envelope Elimination and Restoration (EER). FIG. 11A illustrates an example of an EER system 1100. In the EER system 1100, an RF signal at an input port 600 is split into two paths: an upper path 1101 and a lower path 1103. In the upper path 1101, the RF signal at the input port 600 is fed into an envelope detector 1101 for detecting an envelope of the input signal. The envelope detector 1105 is in series with and coupled to a pulse width modulator (PWM) 1107 for digitizing the envelope signal from the detector 1105. The PWM 1107 is coupled to a Class-S Modulator 1109 which receives and amplifies the digitized envelope signal transmitted by PWM 1107. A low pass filter (LPF)

1111, which is coupled to the output of the Class-S Modulator 1109, is used for recovering the desired frequency range to the bias input of a conventional PA 1117. In the lower path 1103, the RF signal at the input port 600 is fed into a limiter 1113 for eliminating the amplitude modulation components and retaining the phase portion of the signal. The limiter 1113 is further coupled to a time delay 1115 for compensating delay of the modulated signal in the upper path 1101. The time compensated signal at the output of the time delay 1115 is fed into the conventional PA 1117 for amplification to produce an output signal at the output port 607, which is proportional to the RF input signal at the input port 600.

The EER architecture in FIG. 11A may suffer several disadvantages. One disadvantage is switching losses coming from the Class-S modulator 1109 which can increase when the frequency increases. Another disadvantage is clipping problems occurring at the pulse width modulator (PWM) 1107 caused by signals that have large envelope variations and non-linearity originating at the output portion of the envelope detector 1005. To address the large envelope variations, one solution is to replace the pulse width modulator (PWM) 1107, the Class-S modulator 1109, and low pass filter 1111 with a delta-sigma modulator, which also rejects the noise outside the band of interest. In addition, by including MTM filters in the envelope delta-sigma modulated (EDSM) scheme, the band pass filter can achieve a desired bandwidth having a lower loss than with conventional filters. In addition, for this EER architecture, a low pass MTM filter may be utilized. MTM PAs of class-F, inverse class-F, or class-J, for example, can include an integrated filter which is part of the output matching network (OMN) of the PA. Such design can have the advantage of reducing losses introduced when connecting to a conventional filter. High efficiency may be obtained by utilizing a filter that is connected at the output of the PA. This type of an MTM filter design with a harmonic tuner can improve the amplifier's linearity.

Figure 11B:
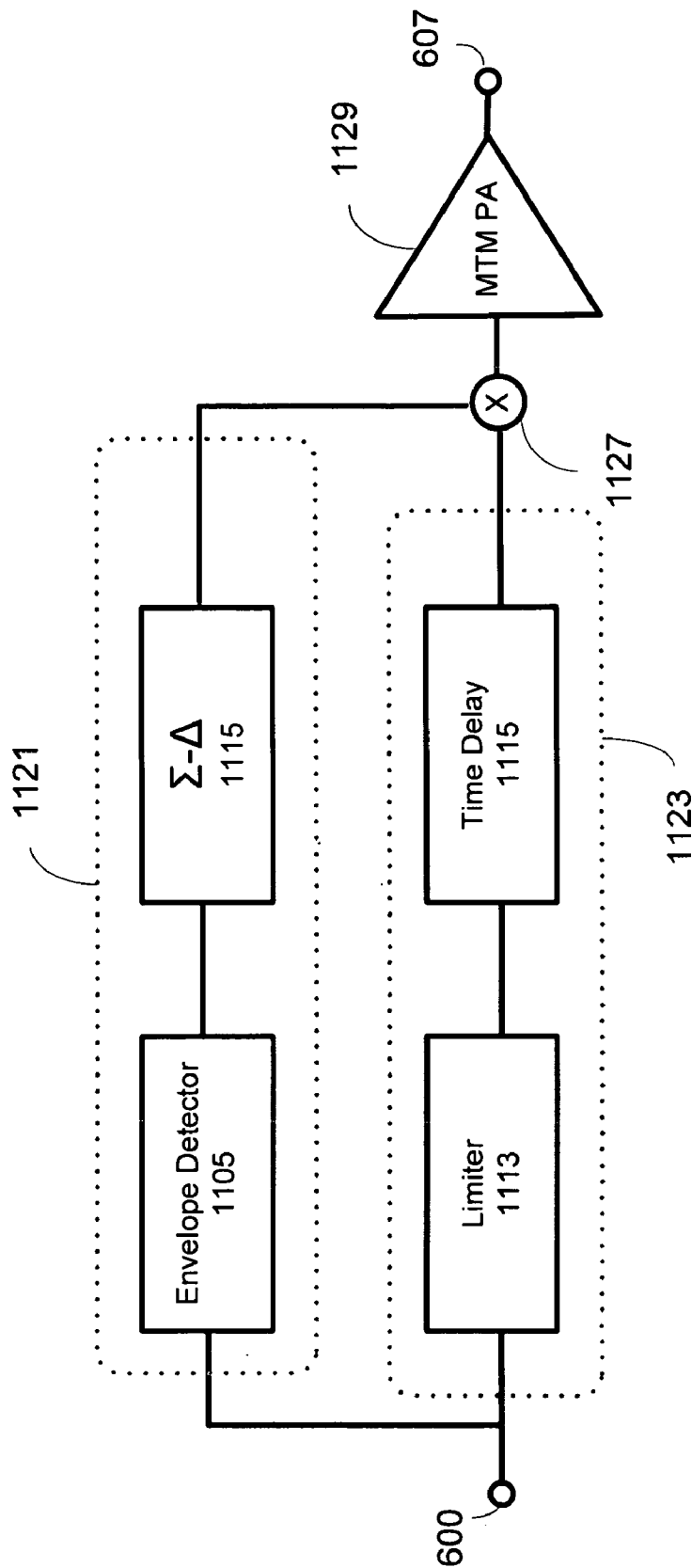
FIGS. 11B-11D illustrates an Integration of MTM PA in Envelope Elimination and Restoration (EER)
Figure 11C:
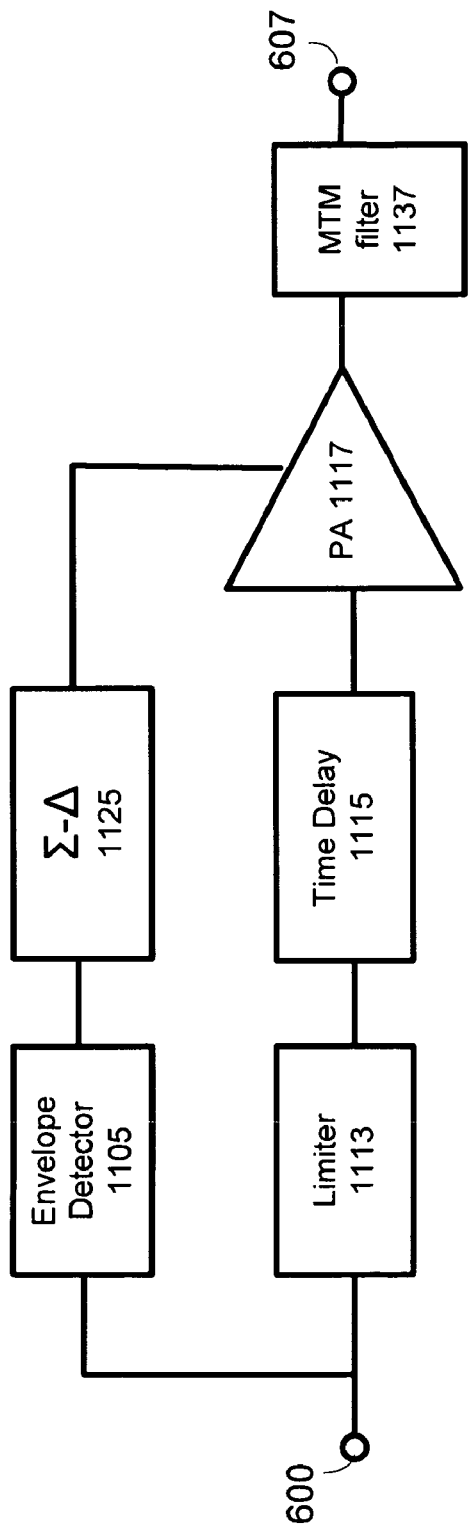
Figure 11D:
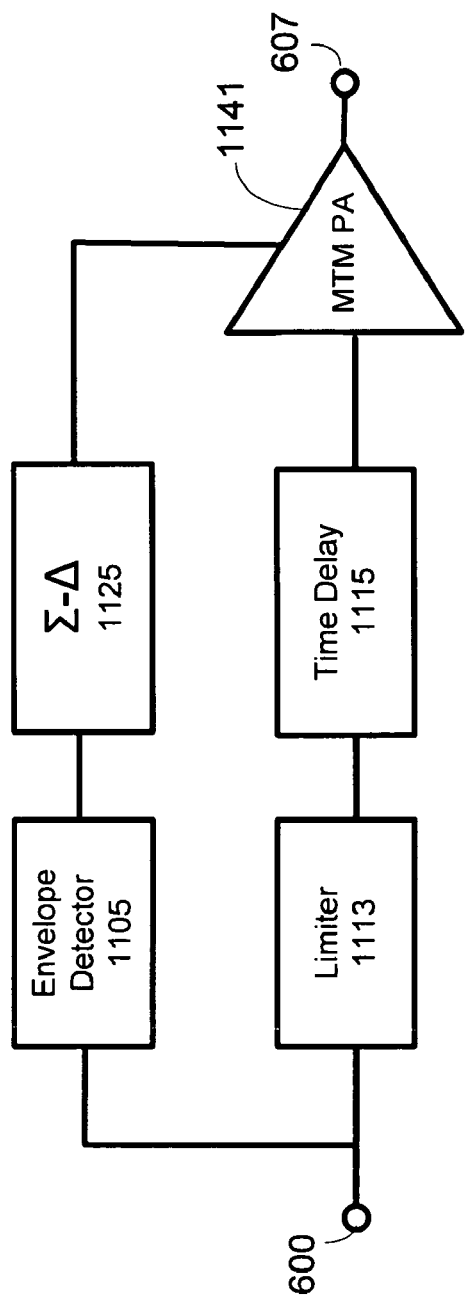

In an exemplary implementation presented in FIGS. 11B-11D, an MTM PA or another MTM circuit element is integrated in the Envelope Elimination Restoration (EER) to enhance the EER.

For example, the EER system in FIG. 11B illustrates an RF signal at an input port 600 that is split into two paths: an upper path 1121 and a lower path 1123. In the upper path 1121, the RF signal at the input port 600 is fed into an envelope detector 1105 for detecting an envelope of the input signal. Envelope detector 1105 is in series with and coupled to a delta-sigma modulator 1125 which digitizes the envelope signal from the detector 1105. The delta-sigma modulator 1125 is coupled to a modulator 1127 that combines the two paths where the output of the delta-sigma modulator is recombined with the signal in the lower path 1123. In the lower path 1123, the RF signal at the input port 600 is fed into a limiter 1113 for eliminating the amplitude modulation components and retaining only the phase portion of the RF signal. The output of the limiter 1113 is coupled to a time delay 1115 for compensating the delay of the modulated signal in the upper path 1121 so that the signals in the two paths are synchronized in phase at the modulator 1127. The time compensated signal at the output of the time delay 1115 is fed into modulator 1127 and is recombined with the envelope signal in the upper path 1121. In this implementation, the output signal at modulator 1127 is fed into an MTM PA for amplification to produce an output signal at the output port 607, which is proportional to the RF input signal at the input port 600. In another implementation, the MTM PA 1129 can be integrated with a harmonic tuner and a band pass filter which is part of the output matching network of the PA. By integrating the PA with other MTM components, the overall circuit size of the PA can be reduced while improving the performance of the PA.

FIG. 11C illustrates an implementation of the conventional EER system of FIG. 11A. In this implementation, the amplified RF signal generated at the output of the PA 1117 can be coupled to an MTM filter 1137. By including an MTM filter in the EER system of FIG. 11A, a desired bandwidth can be achieved for the band pass filter. In this example, the modulated scheme can be an envelope delta-sigma modulated (EDSM) 1125 scheme or PWM/Class-S/LPF modulated scheme (1107, 1109, 1111) as shown in FIG. 11A.

In FIG. 11D, the PA 1117 and MTM filter 1137 of FIG. 11C are replaced by an MTM PA 1141. The MTM PA 1141 is a PA with a CRLH MTM structure to enhance the PA performance and to reduce the PA dimension. The MTM PA 1141 may also include an integrated filter. Because the MTM PAs are designed as a block, the MTM PA 1141 can be optimized with all the MTM components. This design integration methodology can have several advantages, such as the ability to reduce circuit size and improve overall performance of the PA. The MTM PA can be designed as class-F, inverse class-F, or class-J power amplifiers.

A MTM-based multi-PA system can also include an input port that receives an input RF signal and multiple transmission lines based on CRLH MTM structures and connected in series to receive the input RF signal from the input port. Each transmission line has a CRLH MTM structure to produce, at a given operating frequency or resonance, a zero phase delay or a phase delay of n360° where n is a non-zero integer and including a branch output port that splits a portion of the RF signal as a respective branch RF signal for the transmission line and different transmission lines producing different respective branch RF signals. This system includes multiple power amplifiers that are coupled to the branch output ports of the transmission lines, respectively where each power amplifier receives and amplifies a respective branch RF signal to produce an amplified branch RF signal. A power combiner based on a CRLH MTM structure is coupled to receive the amplified branch RF signals from the power amplifiers and to combine the received amplified branch RF signals into a combined output RF signal.

Figure 12:
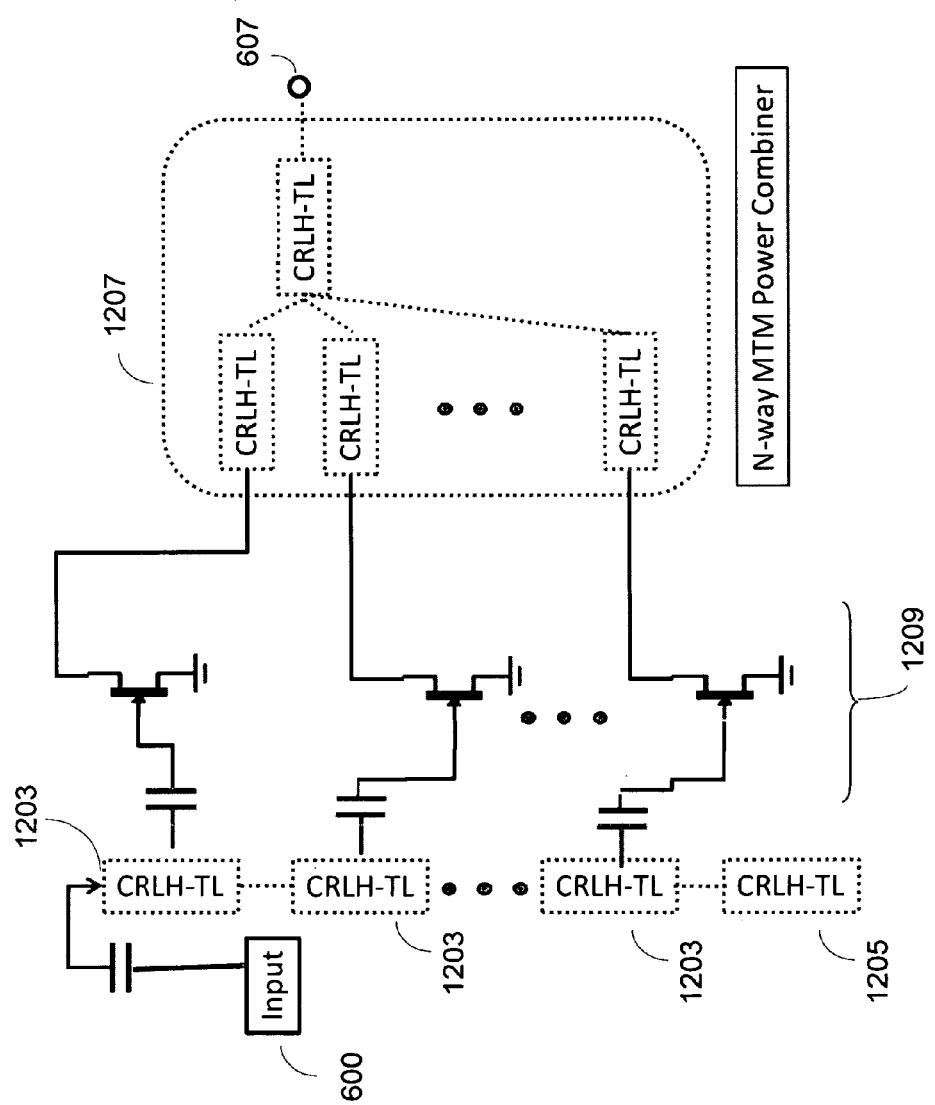
FIG. 12 illustrates a Series Fed Parallel Combining Distributed Amplifier with Zero Degree CRLH TL.

FIG. 12 shows one example of such a system where a series fed parallel combining distributed amplifier includes zero-degree CRLH TLs 1203. At the input of each transistor 1209 there may be a zero degree CRLH TL 1203. All of these zero degree CRLH TLs form a series zero degree CRLH TL which is terminated with a load 1205. An MTM power combiner 1207 is coupled to the outputs of the transistors 1209 to combine the amplified outputs into a single output signal. The zero degree CRLH TL 1203 and the MTM power combiner 1207 can be designed to provide multi-band operations and optimize the matching and power transfer in multiple bands. In addition, the zero degree CRLH TL 1203 provides filtering of 2nd and 3rd harmonic frequencies because the characteristic impedance can be a function of the signal frequency. Therefore, the efficiency of the structure shown in FIG. 12 may be enhanced in comparison to some other PA structures.

Figure 13:
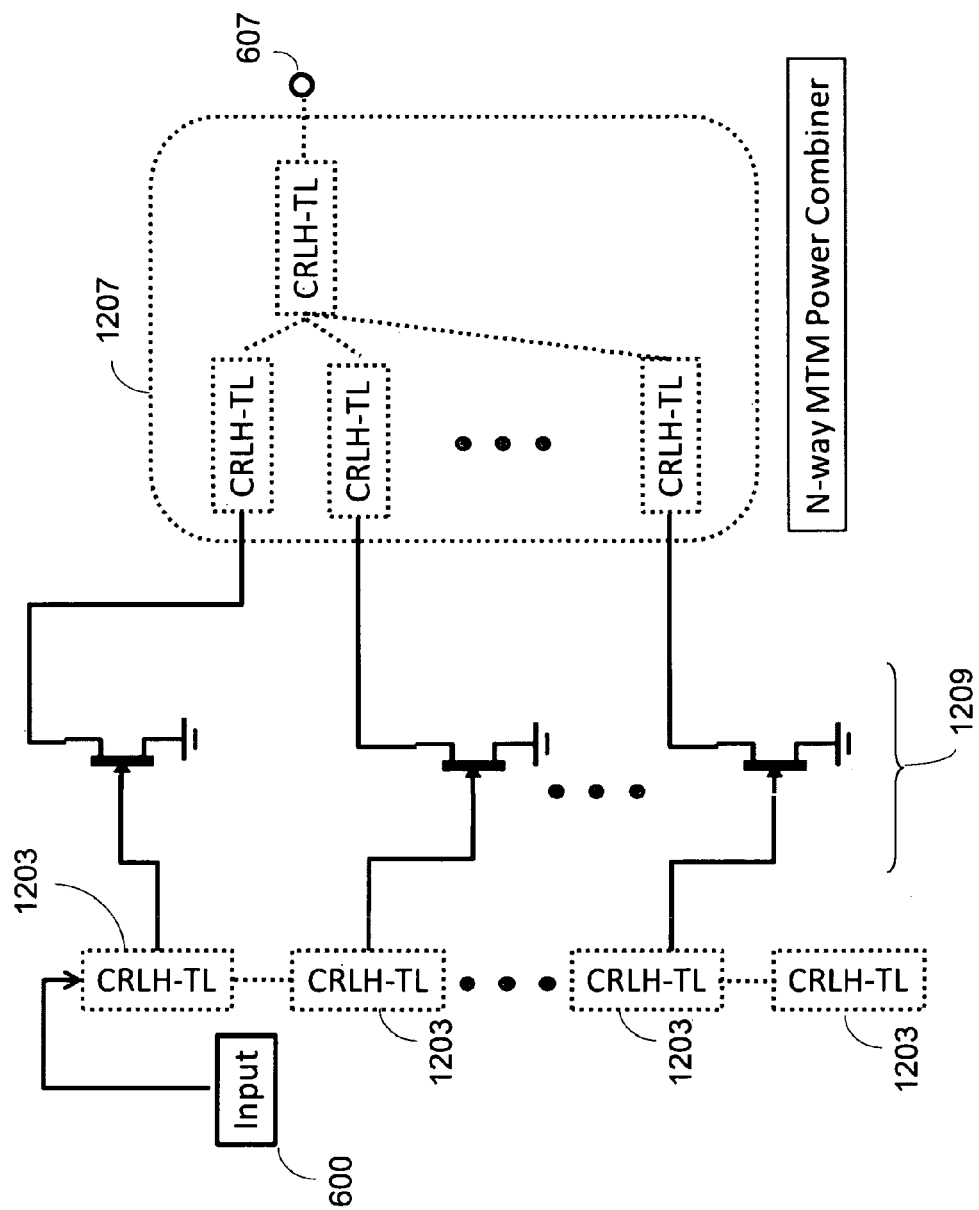
FIG. 13 illustrates a Series Fed Parallel Combining Distributed Amplifier with Zeroth Order Resonator.

In yet another implementation shown in FIG. 13, a series fed parallel combining distributed amplifier may include a zeroth order resonator. In this implementation, there may be a zeroth order resonator at the input 600 which provides a stationary wave at the input in the resonator with a filtering effect and no energy dissipated at the load 1205 as in the previous case. As a result, a better efficiency and a better linearity may be obtained.

Figure 14:
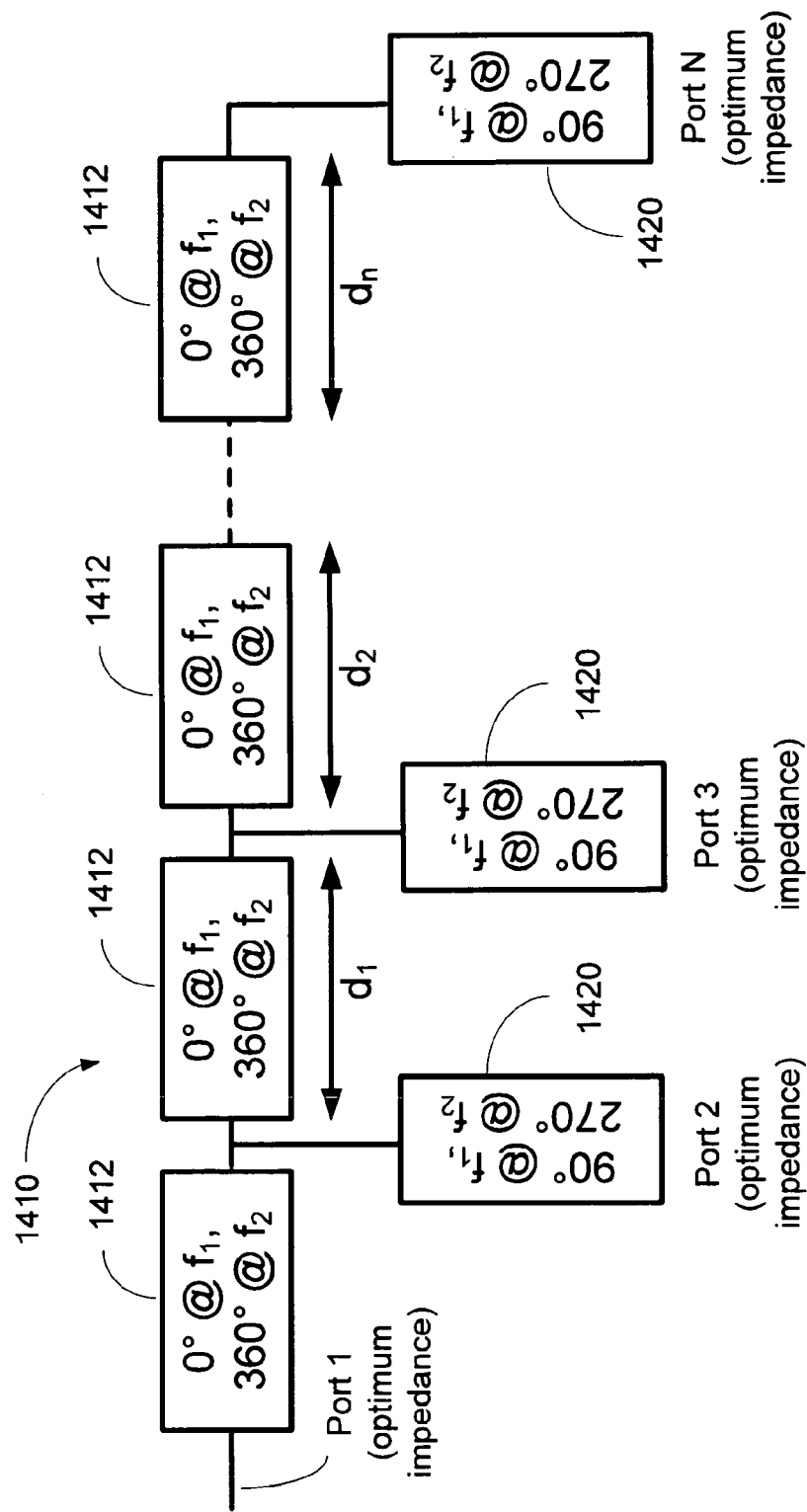
FIG. 14 illustrates an N-Port Multi-band Zero Degree CRLH TL.
Figure 15:
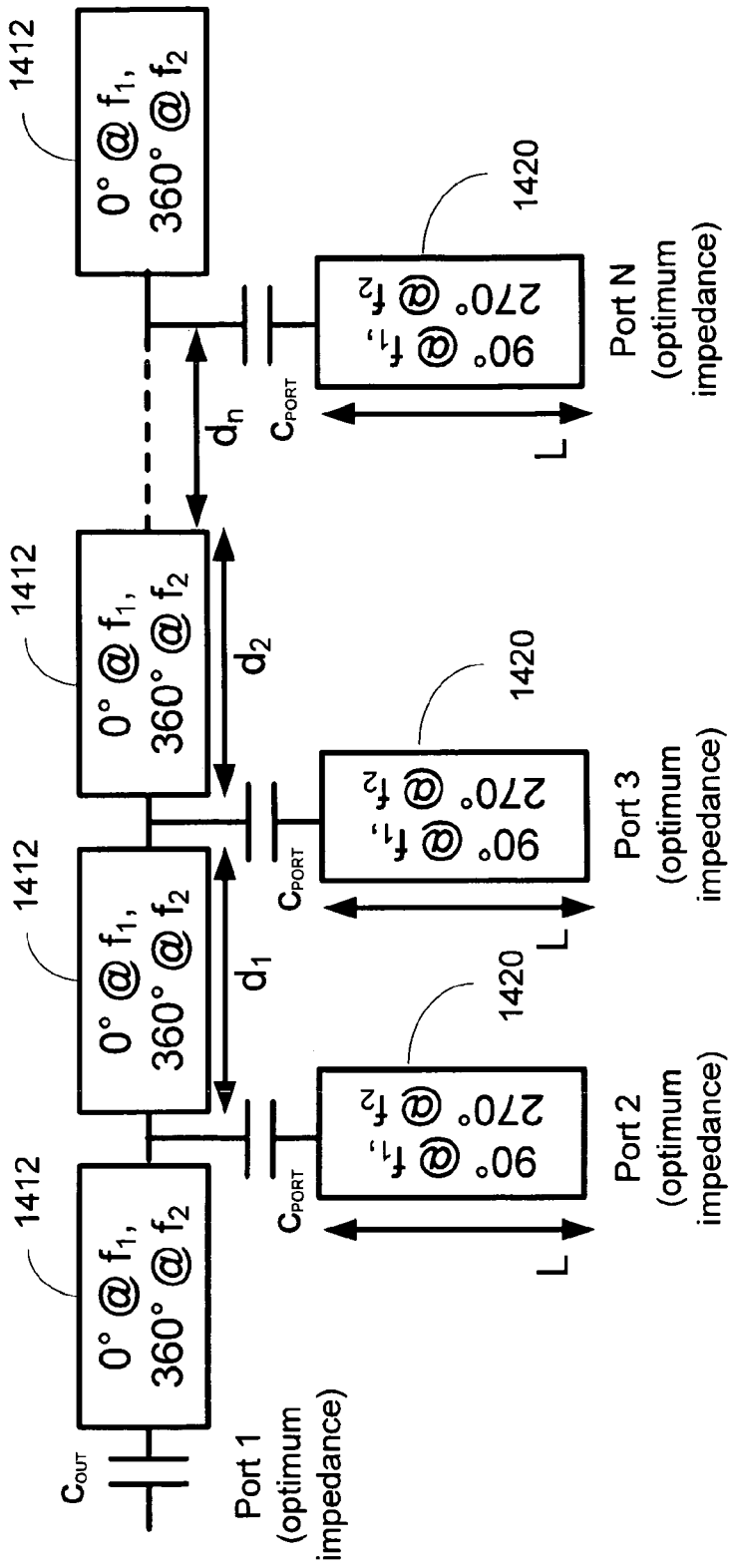
FIG. 15 illustrates an N-port Multi-band zeroth order resonator.

The exemplary implementations illustrated in FIGS. 14 and 15 depict the zero degree CRLH TL and the zeroth order resonator used in FIGS. 12 and 13, respectively. Under these designs, a dual-band or multi-band main CRLH transmission line is structured to exhibit, at least, a first phase at a first signal frequency f1 and a second phase at a second, different signal frequency f2. This main CRLH transmission line includes CRLH unit cells coupled in series and each CRLH unit cell has a first electrical length that is a multiple of +/−180 degrees at the first signal frequency and a second, different electrical length that is a different multiple of +/−180 degrees at the second signal frequency. Two or more branch CRLH feed lines are connected at different locations on the CRLH transmission line to combine signals in the CRLH feed lines into the CRLH transmission line or to divide a signal in the CRLH transmission line into different signals to the CRLH feed lines. Each branch CRLH feed line includes at least one CRLH unit cell that exhibits a third electrical length that is an odd multiple of +/−90 degrees at the first signal frequency and a fourth, different electrical length that is a different odd multiple of +/−90 degrees at the second signal frequency. As illustrated, each CRLH feed line 1020 is connected to a location between two adjacent CRLH unit cells or at one side of a CRLH unit cell.

The device in FIG. 14 includes a dual-band main CRLH transmission line 1410 with dual-band CRLH TL unit cells 1412 and branch CRLH feed lines 1420. Each unit cell 1412 is designed to have an electrical signal length equal to a phase of zero degree at the first signal frequency f1 and a second electrical signal length equal to a phase of 360 degrees at the second signal frequency f2. Each branch CRLH feed line 1420 includes one or more CRLH unit cells and is configured as a dualband CRLH TL quarter wavelength transformer. The optimum impedances are transformed via the CRLH TL quarter wavelength transformer 1420 of a length L at 2 different frequencies, f1 and f2. In this particular example, each CRLH feed line 1420 is designed to have a phase of 90° (λ/4) [modulo π] at the first signal frequency f1 and a phase of 270° (3λ/4) [modulo π] at the second signal frequency f2. This device has 0 degree phase difference at one frequency and 360° at another frequency between each port.

The device in FIG. 15 illustrates a dual-band resonator serial power combiner/divider. This dual-band CRLH TL performs as a resonator by being terminated with an open ended. The output/input ports (port 1-N) can be matched to 50Ω, while the other ports are match to optimum impedances. These optimum impedances are transformed via a CRLH TL quarter wavelength transformer of length L at 2 different frequencies, f1 and f2. By way of example f1 has a phase of 90° (λ/4) [modulo π] while f2 has a phase of 270° (3λ/4) [modulo π].

The two signal frequencies f1 has f2 do not have a harmonic frequency relationship with each other. This feature can be used to comply with frequencies used in various standards such as the 2.4 GHz band and the 5.8 GHz in the Wi-Fi applications. In this configuration, the port position and the port number along the dual-band CRLH TL 1410 can be selected as desired because of the zero degree spacing at f1 and 360° at f2 between each port.

Figure 16:
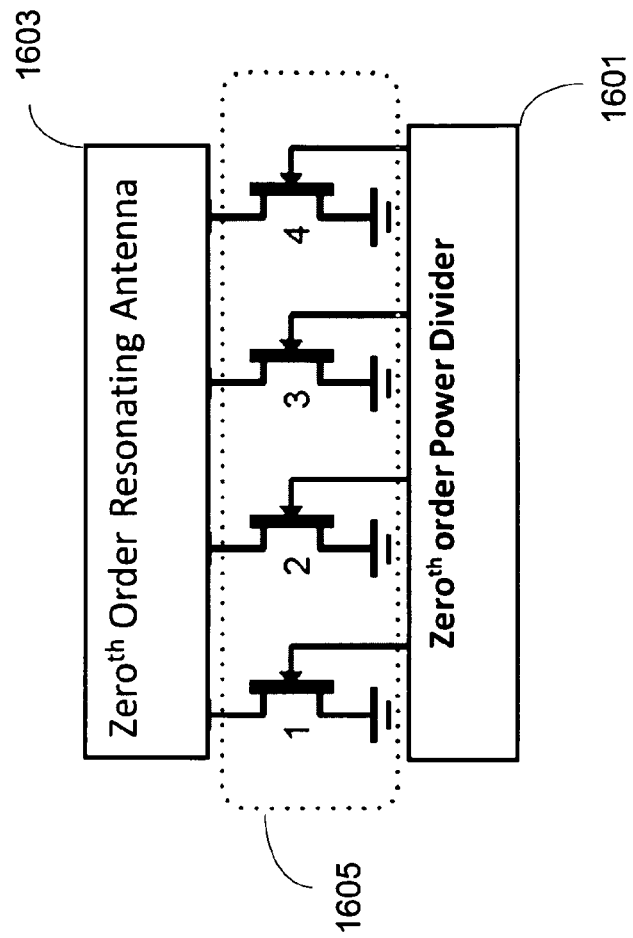
FIG. 16 illustrates an MTM Amplifying Antenna.

In another implementation shown in FIG. 16, an MTM amplifying antenna is comprised of a serial zeroth order resonator power divider 1601 at the input of each transistor 1605 and a zeroth order resonating antenna 1603 at the output of each transistor 1605. Therefore, in this architecture, the output signals are combined in the zeroth order resonating antenna without a power combiner. U.S. Pat. Nos. 7,482,893 and 7,330,090 disclose examples of zeroth order resonating antennas and power dividers which can be used to implementing the design in FIG. 16 and are incorporated by reference as part of the disclosure of this document. In other implementations, the antenna 1603 may be implemented by a leaky wave antenna.

The MTM technology can be used to provide broadband or multi-band power combiner/splitters in compact packages. Some implementations can use 3-dB power combiner/splitters to decrease losses in the MTM balanced PA, thereby improving the overall efficiency of the system.

Figure 17:
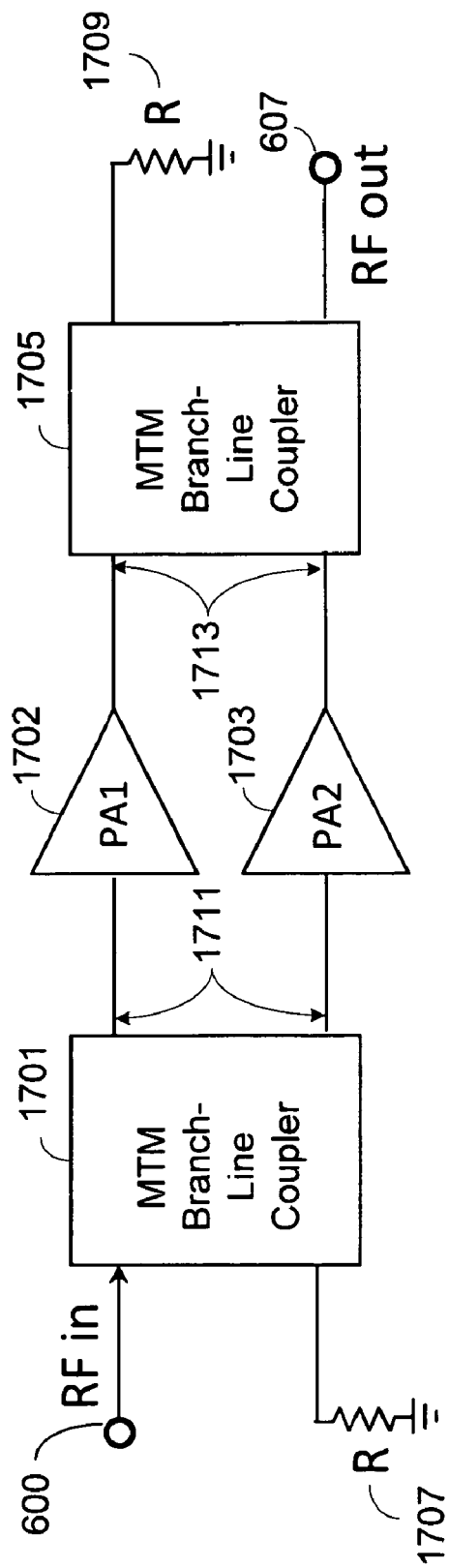
FIG. 17 illustrates an MTM Balanced Power Amplifier.

In the example shown in FIG. 17, a balanced PA is comprised of a quadrature coupler such as an MTM branch line coupler 1701, two identical PAs (1702, 1703), and an MTM branch line coupler 1705. The RF signal is received at the input port 600 of the MTM branch line coupler 1701 and split equally into two outputs 1711 having a 90° phase difference. The signals at two outputs 1711 are fed into PA1 1702 and PA2 1703. The remaining port of the MTM branch line coupler 1701 is terminated with a resistor R 1707. The outputs of the PA1 1702 and PA2 1703 are connected to two inputs 1713 of the MTM branch line coupler 1705. One output of the MTM branch line coupler 1705 is used as the RF output 607 and the other one is terminated by using a resistor R 1709.

The advantage of using the quadrature coupler at the input is that the reflected signals caused by the impedance mismatch at inputs of the PAs can return to the RF input port in anti-phase. Therefore, the reflected signals are canceled, and the input voltage standing wave ratio (VSWR) may be better than the one without the quadrature coupler.

The same reason generally applies to the usage of a quadrature coupler at the outputs of the PAs. The output VSWR can be improved by using other quadrature couplers such as, for example, a microwave branch line coupler or a Lange coupler. However, the conventional microwave branch line coupler only provides a narrow band and is generally bulky, while the Lange coupler requires complicated fabrication processes such as wire bonding or microwave bridge.

The PA systems can also be designed to support either a wide operational bandwidth or at least two bands.

Figure 18:
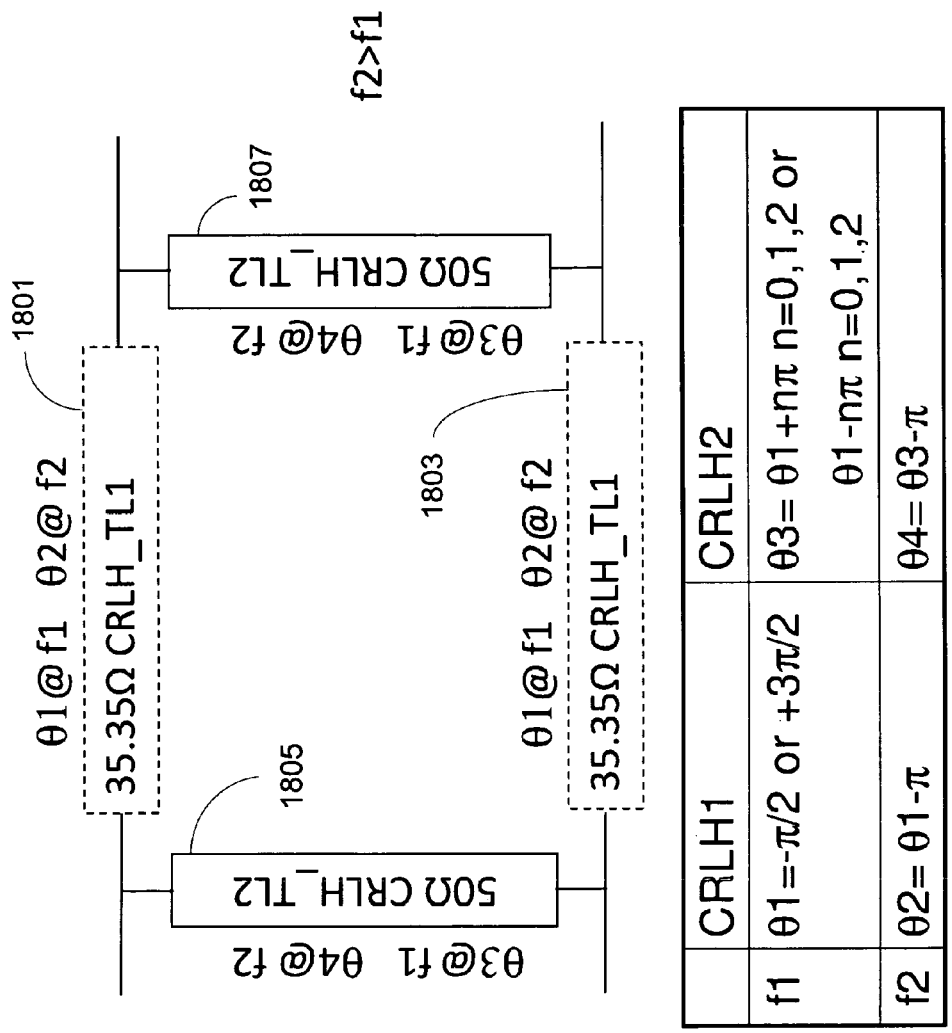
FIG. 18 illustrates a Multi-band MTM Branch Line Coupler.

In one example shown in FIG. 18, a multi-band MTM branch line coupler includes four CRLH-TL branches, where two ends of the CRLH-TL1 1801, 1803 are connected to the CRLH-TL2 1805, 1807 and two ends of the CRLH-TL2 1805, 1807 are connected to the CRLH-TL1 1801, 1803. CRLH-TL1 1801, 1803 has phases of θ1 at f1 and θ2 at f2 while CRLH-TL2 1805, 1807 has phases of θ3 at f1 and θ4 at f2, where f2 is larger than f1. The θ1, θ2, θ3 and θ4 have to satisfy the phase requirement listed in FIG. 18 in order to provide a 3 dB power division and quadrature phase between two outputs. In addition, the characteristic impedance of CRLH-TL1 1801, 1803 and CRLH-TL2 1805, 1807 are 35.35Ω and 50Ω, respectively. By using MTM technology, these branch line couplers can be made smaller in size as compared to the conventional branch line couplers.

Figure 19:
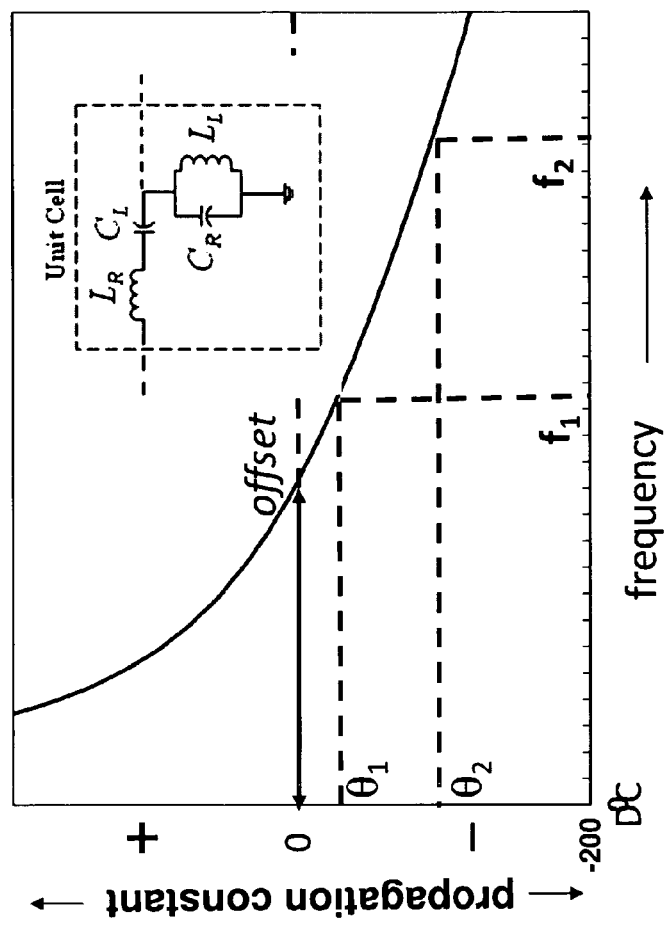
FIG. 19 illustrates a Dispersion Diagram of CRLH-TL.

FIG. 19 illustrates an exemplary dispersion diagram of a CRLH-TL, which may be a nonlinear curve and may have zero phase delay at a non-DC frequency. As a result, the phase advance/delay of θ1 and θ2 can be arbitrarily chosen at arbitrary frequencies of f1 and f2.

Figures 20A, 20B, 20C:
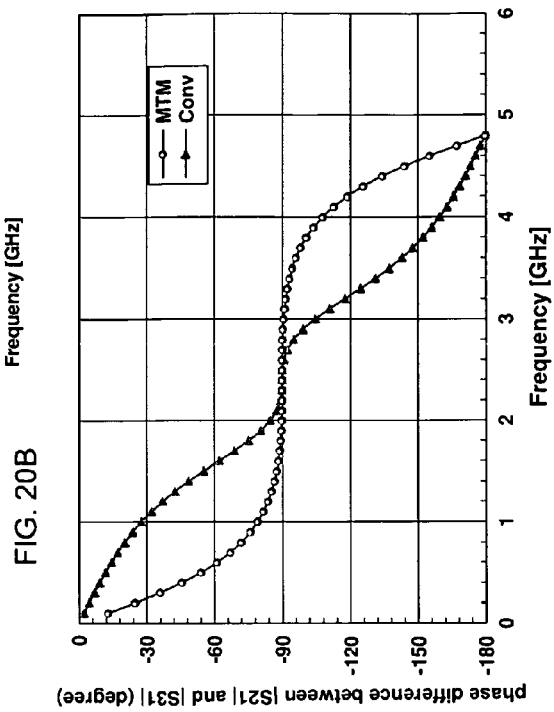
FIG. 20A illustrates a Broadband MTM Branch Line Coupler.
FIG. 20B illustrates a plot of the return and insertion loss comparing the Broadband MTM Branch Line Coupler with a conventional branch line coupler.
FIG. 20C illustrates a plot of the phase difference between |S21| and |S31|.

PA systems with a wide operational bandwidth can use a branch line coupler with a wide bandwidth. FIG. 20A shows an example where a broadband branch line coupler includes four CRLH-TLs 2011, 2013, 2015, 2017 coupled to form a 4-port coupler. In one implementation, P1 2001 is the input and P2 2002 and P3 2003 are the two outputs, and P4 2004 can be designed to handle reflection or to be isolated from the other ports. Due to the symmetry of the branch line coupler, the input and output ports can be used interchangeably. By choosing θ1=−90° and θ2=+90°, the branch line coupler may provide broader bandwidth as compared to the conventional branch line coupler.

FIG. 20B illustrates a comparison of the return loss and insertion loss between the broadband MTM branch line coupler and conventional branch line coupler. In comparison to the conventional case, the MTM branch line coupler covers a broader frequency range in both return loss and insertion loss responses. FIG. 20C also affirms that the bandwidth of the phase difference between |S21| and |S31| is wider for the MTM branch line coupler than the conventional branch line coupler.

Figure 21:
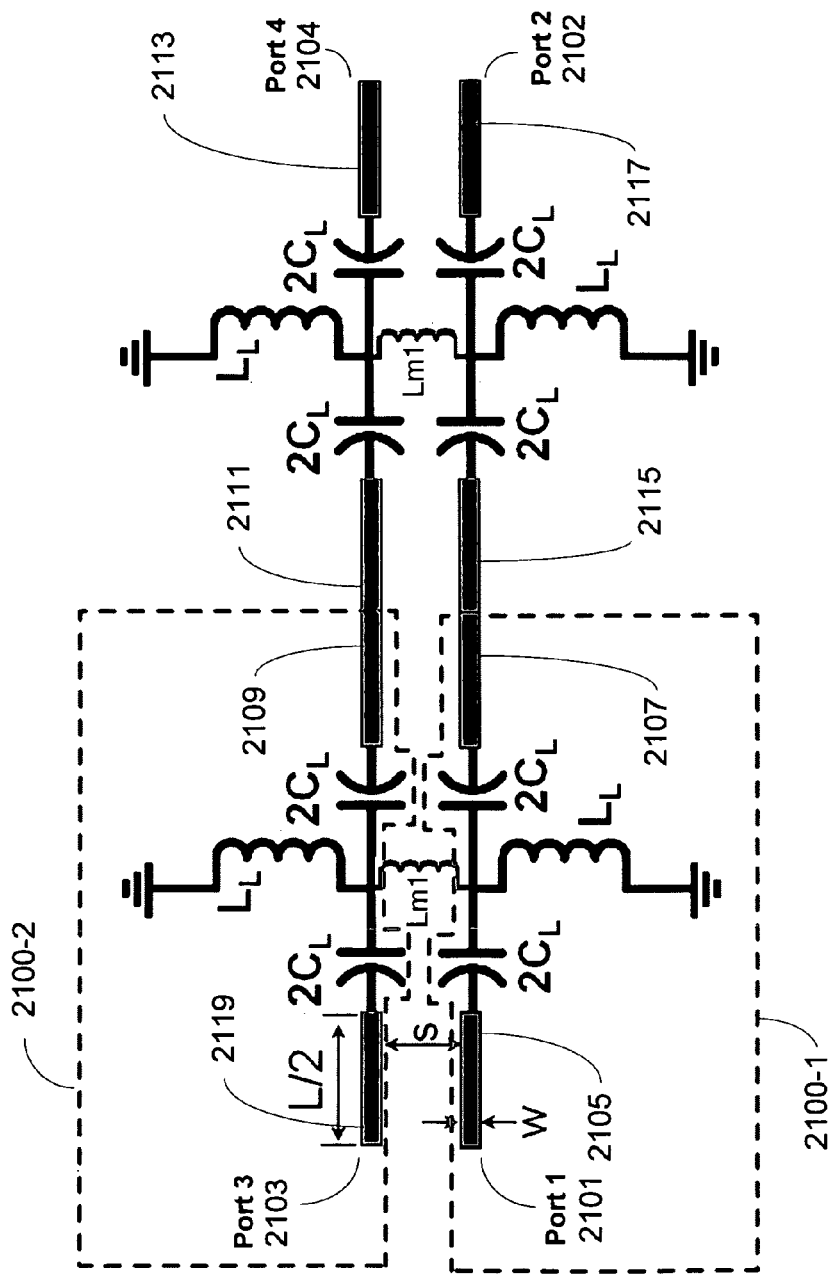
FIG. 21 illustrates a Planar MTM Forward-Wave (FW) Directional Coupler.

FIG. 21 illustrates another implementation of the MTM broadband coupler known as a planar MTM forward-wave (FW) directional coupler. Examples for such an MTM broadband coupler re described in the U.S. patent application Ser. No. 12/340,657 which is incorporated by reference as part of this document. This planar MTM FW directional coupler is implemented by cascading two coupled metamaterial cells horizontally. The coupled metamaterial cell is realized by paralleling two metamaterial unit cells, for example, 2100-1 and 2100-2, with an additional inductor $L_{ml}$ connecting between the two cells. Each metamaterial unit cell 2100 comprises two transmission lines, two series capacitors of $2C_L$ and one shunt inductor of $L_L$. In this exemplary implementation shown in FIG. 21, the two transmission lines associated with an input port, Port 1 2101, are represented by 2105 and 2107. The two transmission lines associated with a transmission port, Port 2 2102, are represented by 2115 and 2117. The two transmission lines associated with a coupling port, Port 4 2104, are represented by 2111 and 2113. The two transmission lines associated with an isolation port, Port 3 2103, are represented by 2109 and 2119. The mutual inductor and capacitor of $L_m$ and $C_m$ are introduced when two transmission lines of each unit cell are close to each other. See transmission lines 2107 and 2109, for example. These two transmission lines may possess the intrinsic series inductance of $L_R$ along the line and the shunt capacitance $C_R$ between the lines and the ground. This planar MTM FW directional coupler can provide a wide band of return loss and 3 dB insertion loss at each output port. The planar MTM FW directional coupler described above can be implemented in the balanced power amplifier for the input and output sections.

Figure 22A:
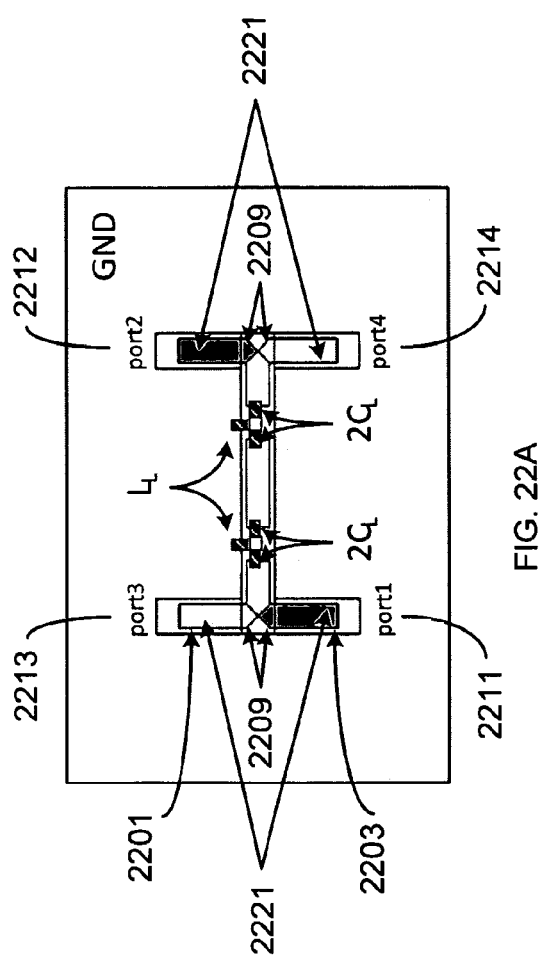
FIG. 22A illustrates a Vertical MTM Forward-Wave (FW) Directional Coupler.
Figure 22B:
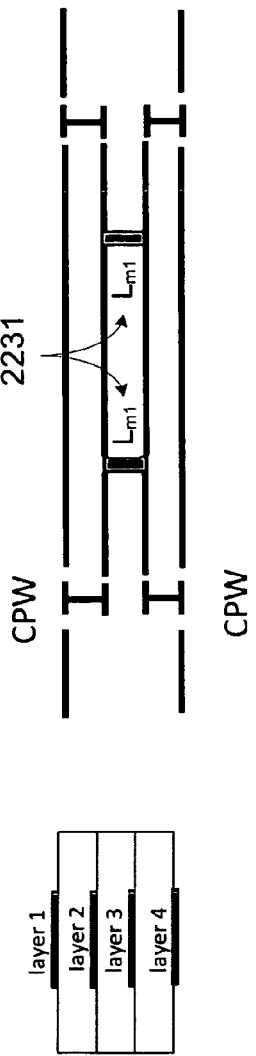
FIG. 22B illustrates a cross-section view of the Vertical MTM FW Directional Coupler shown in FIG. 22A.

FIGS. 22A-22B illustrates another implementation of the MTM coupler known as a vertical MTM FW directional coupler. Examples of this vertical MTM FW directional coupler are also described in the U.S. patent application Ser. No. 12/340,657. The FW coupler in this implementation may be constructed by cascading two coupled metamaterial cells. In this exemplary implementation, the coupled metamaterial cell is built by paralleling two metamaterial transmission lines 2201, 2203 vertically with an additional inductor $L_{ml}$ 2231 connecting between the two metamaterial transmission lines which indicates one metamaterial transmission line 2201 is on top of the substrate and the other metamaterial transmission line 2203 is on the bottom of the substrate. The cross-sectional view of this MTM FW coupler is shown in FIG. 22B. Each metamaterial transmission line 2201, 2203 includes two metamaterial unit cells. Each unit cell comprises two sections of transmission line, two series capacitors of $2C_L$ and one shunt inductor of $L_L$. The vertically coupled transmission lines provide mutual inductance $L_m$ and mutual capacitance $C_m$. In addition, each port of the metamaterial coupled lines is connected to the 50Ω CPW 2221 through a CPW bend. In this implementation, there are a total of four CPW lines 2221 and four CPW bends 2209. The MTM FW coupler in this example may also provide a broad bandwidth of return loss and 3 dB insertion loss at each output port. The vertical MTM FW directional coupler can be used in the balanced power amplifier for the input and output sections.

Figure 23:
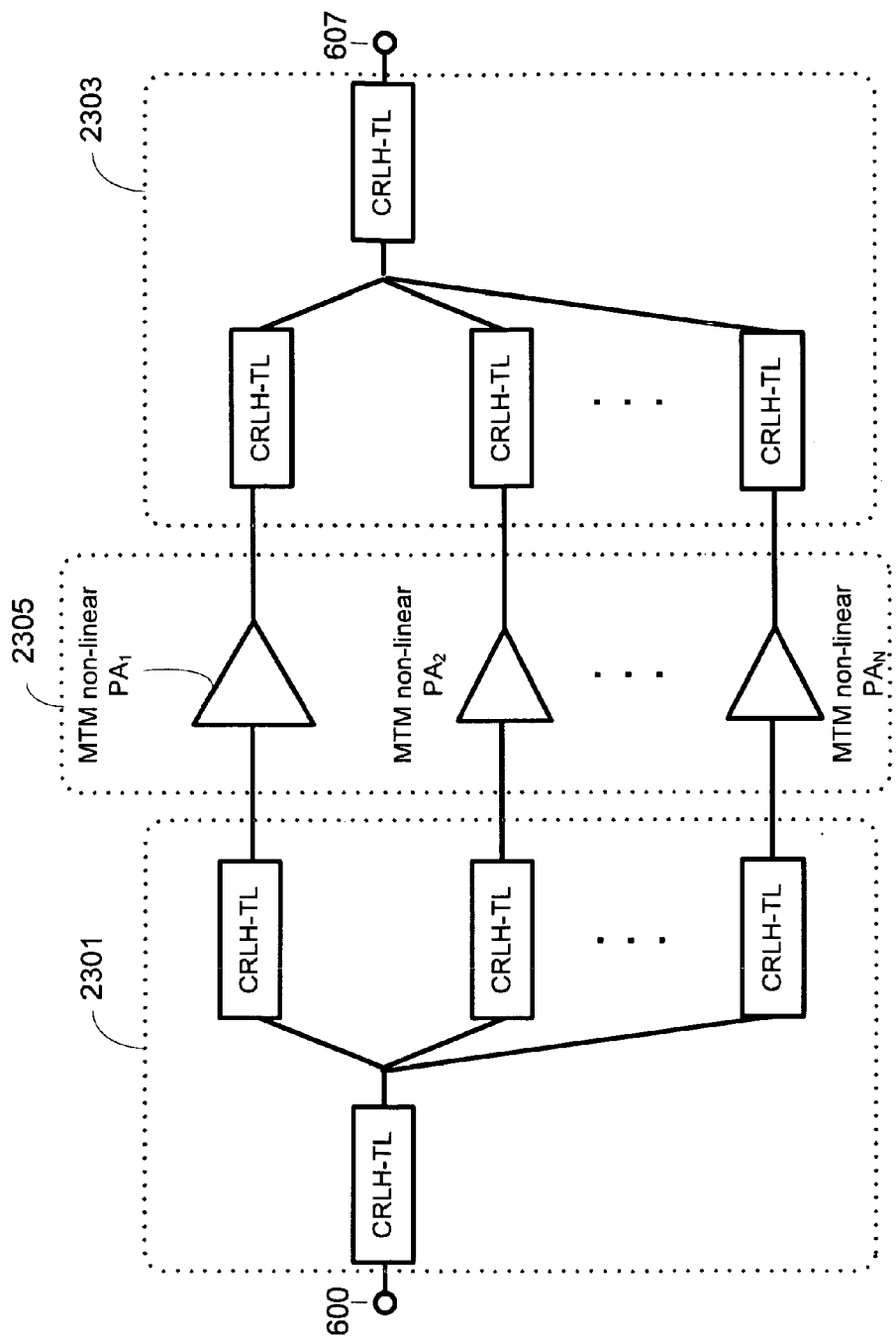
FIG. 23 illustrates an MTM LINC PA.

Linear amplification using non-linear components (LINC) is formed by adding two signals vectorialy to achieve power amplification. In the exemplary implementation presented in FIG. 23, a LINC architecture includes MTM LINC (non-linear) PAs 2305 coupled to an N-way MTM Power Splitter 2301 at the input stage and N-way MTM Power Combiner 2303 at the output stage. Alternatively, conventional LINC PAs can be used. MTM PAs can support multi-band RF signals with its compact size and provide low loss, resulting in high efficiency. One disadvantage of conventional LINC amplifiers is the complexity of the hardware; some applications require extensive signal processing, which makes the LINC architecture bulky and expensive. The MTM PAs may reduce the complexity of the hardware and provide broadband with high efficiency. The MTM can achieve a flat slope for the phase in a certain range of frequencies. In other words, the same phase can be achieved at different frequencies which can improve the phase matching of the combined PAs.

Figure 24:
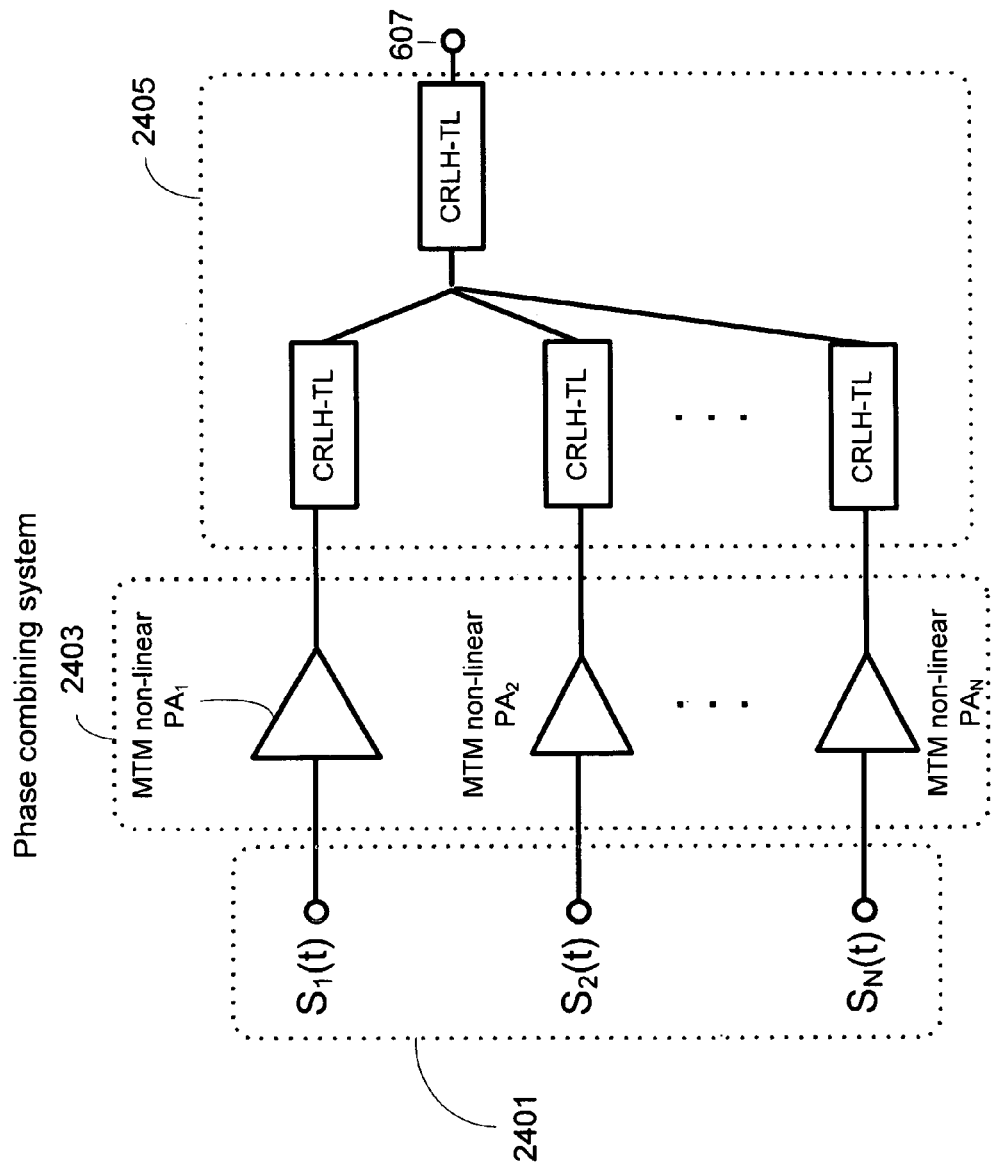
FIG. 24 illustrates an MTM LINC PA for different signals.

In an exemplary implementation of a phase combining system, shown in FIG. 24, different MTM non-linear PAs 2403 may be fed with different signals and different phases, which may be combined in phase with an N-way MTM power combiner 2405 or other power combiners such as an MTM Wilkinson power combiner shown in FIG. 5A-5B and previously described. Each PA is fed with an RF input signal. In this configuration, the use of MTM structures can be designed to allow a certain frequency to pass while blocking other frequencies. Therefore, the PA architecture of FIG. 24 can implement this design when input signals have different frequency bands or a single frequency band.

While this document contains many specifics, these should not be construed as limitations on the scope of any invention or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations have been described. Variations and enhancements of the described implementations and other implementations can be made based on what is described and illustrated.

What is claimed is what is described and illustrated, including:

1. A device based on a Composite Right and Left Handed (CRLH) Metamaterial (MTM) structure, comprising:

a first transmission line including a Composite Right and Left Handed (CRLH) Metamaterial (MTM) structure, a first terminal that is terminated at a first impedance and a second terminal;

a plurality of second transmission lines of CRLH MTM structures that are coupled to the second terminal of the first transmission line and are configured to either split an input RF signal received from the second terminal of the first transmission line into a plurality of output RF signals in the second transmission lines, respectively, or to combine a plurality of input RF signals in the second transmission lines into an output RF signal at the second terminal of the first transmission line, each second transmission line having a first terminal that is coupled to the second terminal of the first transmission line and a second terminal that is terminated at a respective second impedance, wherein the first transmission line and the second transmission lines are structured to provide impedance match between the first impedance at the first terminal of the first transmission line and a respective second impedance of each of the second transmission lines, and wherein the first transmission line and the second transmission lines are structured to be in a first configuration where the first transmission line is a CRLH MTM transmission line of an electrical length having a phase delay of ±m90° where m is a positive odd integer, and each of the second transmission lines is a CRLH MTM transmission line of an electrical length having a zero phase delay or a phase delay of ±n180° where n is a positive integer, or in a second configuration where the first transmission line is a CRLH MTM transmission line of an electrical length having a zero phase delay or a phase delay of ±m180° where m is a positive integer and each of the second transmission lines is a CRLH MTM transmission line having a phase delay of ±n90° where n is a positive odd integer.

2. The device as in claim 1, wherein:
the second transmission lines have different impedances.

3. The device as in claim 1, wherein:
the second transmission lines have substantially equal impedances.

4. The device as in claim 1, wherein:
the first transmission line has resonances at two or more different RF frequencies; and
each second transmission line is structured to have resonances at the two or more different RF frequencies of the first transmission line.

5. A power amplifier system, comprising:
an RF input port configured to receive an input RF signal;
an envelope detector coupled to the RF input port and configured to receive a first portion of the input RF signal and to extract information on an amplitude envelope of the input RF signal to produce an envelope signal;
a sigma-delta modulator coupled to the envelope detector and configured to convert the envelope signal into a first signal;
a limiter circuit coupled to the RF input port and configured to receive a second portion of the input RF signal and to eliminate amplitude modulation components of the input RF signal to produce a second signal that retains phase of the input RF signal;
a time delay circuit coupled to the limiter circuit and configured to cause a delay in the second amplifier input signal to synchronize with the first signal;
a modulator coupled to receive the first and second signals and configured to combine the received first and second signals into a third signal; and
a power amplifier coupled to the modulator and configured to receive and to amplify the third signal into an output RF signal that is proportional to the input RF signal, wherein the power amplifier is a Composite Right and Left Handed (CRLH) Metamaterial (MTM) structure power amplifier.

6. A power amplifier system, comprising:
an RF input port configured to receive an input RF signal;
an envelope detector coupled to the RF input port and configured to receive a first portion of the input RF signal and to extract information on an amplitude envelope of the input RF signal to produce an envelope signal;
a sigma-delta modulator coupled to the envelope detector and configured to convert the envelope signal into a first signal;
a limiter circuit coupled to the RF input port and configured to receive a second portion of the input RF signal and to eliminate amplitude modulation components of the input RF signal to produce a second signal that retains phase of the input RF signal;
a time delay circuit coupled to the limiter circuit and configured to cause a delay in the second amplifier input signal to synchronize with the first signal;
a power amplifier coupled to receive the first and second signals and configured to produce an output RF signal that is proportional to the input RF signal; and
a filter coupled to the power amplifier and configured to filter the output RF signal and having a Composite Right and Left Handed (CRLH) Metamaterial (MTM) structure.

7. The system as in claim 6, wherein:
the power amplifier is a Composite Right and Left Handed (CRLH) Metamaterial (MTM) power amplifier.

8. A power amplifier system for amplifying an RF signal, comprising:
a Zero$^{th}$ order resonator power divider having a Composite Right and Left Handed (CRLH) Metamaterial (MTM) structure and configured to receive an input RF signal and to split the received input RF signal into branch RF signals in phase with respective to one another;
a plurality of transistors coupled to the Zero$^{th}$ order resonator power divider and configured to receive the branch RF signals, respectively, and to amplify the received branch RF signals; and
a Zero$^{th}$ order resonating antenna based on a CRLH MTM structure and coupled to transistors to receive amplified branch RF signals.

9. A power amplifier system, comprising:
an RF input configured to receive an input RF signal;
a first quadrature coupler based on a Composite Right and Left Handed (CRLH) Metamaterial (MTM) structure and having a first input port coupled to the RF input, the first input port being configured to receive the input RF signal, a second input port that is terminated, a first output port and a second output port, the first quadrature coupler being configured to split splitting the input RF signal into a first RF signal at the first output port and a second RF signal at the second output port, the second RF signal having a phase shift of 90 degrees with respect to the first RF signal;
a first power amplifier coupled to the first output port and configured to receive and to amplify the first RF signal;
a second power amplifier coupled to the second output port and configured to receive and to amplify the second RF signal; and
a second quadrature coupler based on a CRLH MTM structure and having a first input port coupled to receive the amplified first RF signal from the first power amplifier, a second input port coupled to receive the amplified second RF signal from the second power amplifier, a first output port that is terminated and a second output configured to output an RF output signal, the second quadrature coupler configured to combine signals received at the first and second input ports with a 90-degree phase shift to produce the RF output signal.

10. The power amplifier system as in claim 9, wherein:
one of the first and second quadrature couplers is a CRLH MTM branch line coupler formed by four CRLH MTM transmission lines.

11. The power amplifier system as in claim 10, wherein:
the first and second quadrature couplers have CRLH MTM structures with resonances at two or more RF frequencies.

12. The power amplifier system as in claim 9, wherein:
one of the first or second quadrature couplers is a planar forward-wave directional coupler based on a CRLH MTM structure that includes unit cells formed in common metallization layers at different horizontal locations in a plane of a substrate in which the unit cells are formed.

13. The power amplifier system as in claim 9, wherein:
one of the first or second quadrature couplers is a vertical forward-wave directional coupler based on a CRLH MTM structure that includes unit cells formed in different metallization layers along a vertical direction perpendicular to a place of a substrate in which the unit cells are formed.

14. An RF communication apparatus comprising:
a system configured to produce an RF signal; and
the power amplifier system according to claim 5, coupled to receive the RF signal at the RF input port.

15. An RF transmission system comprising:
a modulation system configured to produce an RF signal; and
the power amplifier system according to claim 6, coupled to receive the RF signal at the RF input port.

16. An RF transmission system comprising:
a modulation system configured to produce an RF signal; and
the power amplifier system according to claim 8, coupled to receive the RF signal at the RF input port.

17. An RF transmission system comprising:
a modulation system configured to produce an RF signal; and
the power amplifier system according to claim 9, coupled to receive the RF signal at the RF input port.

* * * * *

UNITED STATES PATENT AND TRADEMARK OFFICE
CERTIFICATE OF CORRECTION

PATENT NO. : 8,346,189 B2  
APPLICATION NO. : 13/469640  
DATED : January 1, 2013  
INVENTOR(S) : Dupuy et al.

Page 1 of 2

It is certified that error appears in the above-identified patent and that said Letters Patent is hereby corrected as shown below:

In the Specification:

In Column 3, Line 44, delete "amplifier us" and insert -- amplifier as --, therefor.

In Column 3, Lines 64-65, delete "FIG. 1B......Metamaterial;" and insert the same at Line 65, as a new paragraph.

In Column 4, Line 4, delete "wavelengths" and insert -- wavelengths; --, therefor.

In Column 4, Line 14, delete "N Zero" and insert -- NZero --, therefor.

In Column 4, Lines 53-54, delete "FIG. 20C......|S31|;" and insert the same at Line 54, as a new paragraph.

In Column 7, Line 24, delete "permeability p" and insert -- permeability μ --, therefor.

In Column 8, Line 10, delete "An CRLH" and insert -- A CRLH --, therefor.

In Column 8, Line 45, delete "β (ω$_o$)=0" and insert -- β(ω$_0$)=0 --, therefor.

In Column 8, Line 56, delete "CRHL" and insert -- CRLH --, therefor.

In Column 9, Line 2, delete "θ$_n$=β$_n$l=mπ" and insert -- θ$_m$=β$_m$l=mπ --, therefor.

In Column 9, Line 9, delete "θ$_m$=β$_n$l=mπ," and insert -- θ$_m$=β$_m$l=mπ, --, therefor.

In Column 9, Line 60, delete "(vp=ω/β)" and insert -- (v$_p$=ω/β) --, therefor.

Signed and Sealed this  
Twenty-ninth Day of October, 2013

Teresa Stanek Rea  
*Deputy Director of the United States Patent and Trademark Office*

CERTIFICATE OF CORRECTION (continued)
U.S. Pat. No. 8,346,189 B2

In Column 12, in Table 1, under "|n|=1", Line 26, delete "$M = 2 - \sqrt{2}$" and insert --$M = 2 - \sqrt{2}$--, therefor.

In Column 13, Line 67, delete "$\varphi_n$ is the" and insert -- $\varphi_{11}$ is the --, therefor.

In Column 16, Line 49, delete "based a" and insert -- based on a --, therefor.

In Column 17, Line 57, delete "(peak)" and insert -- peak --, therefor.

In Column 21, Line 43, delete "(port 1-N)" and insert -- (port1-N) --, therefor.

In Column 21, Line 50, delete "fl has f2" and insert -- fl and f2 --, therefor.

In Column 24, Line 5, delete "vectorialy" and insert -- vectorially --, therefor.

In the Claims:

In Column 26, Line 51, in Claim 9, delete "split splitting" and insert -- split --, therefor.